United States Patent [19]
Hosokawa et al.

[11] Patent Number: 5,536,949
[45] Date of Patent: Jul. 16, 1996

[54] CHARGE INJECTION AUXILIARY MATERIAL AND ORGANIC ELECTROLUMINESCENCE DEVICE CONTAINING THE SAME

[75] Inventors: Chishio Hosokawa; Hisahiro Higashi; Tadashi Kusumoto; Kiyoshi Ikeda, all of Sodegaura, Japan

[73] Assignee: Idemistu Kosan Co., Ltd., Tokyo, Japan

[21] Appl. No.: 204,410

[22] PCT Filed: Aug. 26, 1993

[86] PCT No.: PCT/JP93/01198

§ 371 Date: Mar. 15, 1994

§ 102(e) Date: Mar. 15, 1994

[87] PCT Pub. No.: WO94/06157

PCT Pub. Date: Mar. 17, 1994

[30] Foreign Application Priority Data

Aug. 28, 1992 [JP] Japan ..................... 4-230089
May 31, 1993 [JP] Japan ..................... 5-129438

[51] Int. Cl.$^6$ ..................... H01L 35/24; H01L 51/00
[52] U.S. Cl. ..................... 257/40; 257/103; 313/504; 428/690
[58] Field of Search ..................... 257/40, 103; 313/504, 313/507; 428/690, 917

[56] References Cited

U.S. PATENT DOCUMENTS

| | | | |
|---|---|---|---|
| 4,720,432 | 1/1988 | Vanslyke et al. | 428/457 |
| 4,769,292 | 9/1988 | Tang et al. | 428/690 |
| 5,085,947 | 2/1992 | Saito et al. | 428/690 |
| 5,121,029 | 6/1992 | Hosokawa et al. | 313/504 |
| 5,130,603 | 7/1992 | Tokailin et al. | 313/504 |
| 5,227,252 | 7/1993 | Murayama et al. | 428/690 |
| 5,366,811 | 11/1994 | Higashi et al. | 428/457 |

FOREIGN PATENT DOCUMENTS

| | | |
|---|---|---|
| 0373582 | 6/1990 | European Pat. Off. . |
| 0387715 | 9/1990 | European Pat. Off. . |
| 0532798A1 | 3/1993 | European Pat. Off. . |
| 0557534A1 | 9/1993 | European Pat. Off. . |
| 55-159437 | 12/1980 | Japan . |
| 264692 | 11/1988 | Japan . |
| 295695 | 12/1988 | Japan . |
| 2-235983 | 9/1990 | Japan . |
| 250292 | 10/1990 | Japan . |
| 3-152897 | 6/1991 | Japan . |
| 3-174436 | 7/1991 | Japan . |
| 157660 | 7/1991 | Japan . |
| 255190 | 11/1991 | Japan . |

OTHER PUBLICATIONS

Patent Abstracts of Japan, vol. 17, No. 514 (E–1433) 16 Sep. 1993 of JP–A–51 035 878, 1 Jun. 1993.

Patent Abstracts of Japan vol. 17, No. 632 (C–1132) 24 Nov. 1993 of JP–A–51 094 943, 3 Aug. 1993.

Database WPI, Section Ch, Derwent Publications Ltd., London, GB; Class L03, AN 90–278698 of JP–A–2 195 683, 2 Aug. 1990.

*Primary Examiner*—Sara W. Crane
*Attorney, Agent, or Firm*—Frishauf, Holtz, Goodman, Langer & Chick

[57] ABSTRACT

A functional layer, such as a light emitting layer, of an organic electron device, such as an organic electroluminescence device, is provided. The function layer includes a small amount of a charge injection auxiliary material capable of enhancing charge injection properties. The charge injection auxiliary material comprises a stilbene, distyrylarylene or tris(styrylarylene) compound and is employed in an organic electron device wherein a positive-hole transporting organic functional layer is subjected to positive-hole injection from an external layer by incorporating the charge injection auxiliary material in the functional layer. The organic electroluminescence device provided by the present invention has a lowered applied voltage, an enhanced luminous efficiency and a prolonged service life.

18 Claims, 1 Drawing Sheet

5,536,949

CHARGE INJECTION AUXILIARY MATERIAL AND ORGANIC ELECTROLUMINESCENCE DEVICE CONTAINING THE SAME

TECHNICAL FIELD

The present invention relates to a novel charge injection auxiliary material and an organic electroluminescence device containing the same. More particularly, it pertains to a charge injection auxiliary material capable of enhancing charge injecting properties which comprises a derivative of stilbene, distyrylarylene or tris(styrylarylene) and an organic electroluminescence device having a lowered applied voltage, an enhanced light emission efficiency and a prolonged service life which contains the above-mentioned charge injection auxiliary material.

BACKGROUND ART

In recent years, it has been desired that an organic electronic device such an electrophotographic photoreceptor, an organic electroluminescence device (herein-after sometimes abbreviated to an "organic EL device"), organic transistor, an organic sensor and the like be capable of stably and efficiently injecting an electric charge from an electrode or charge generating layer to a charge transporting layer. Examples of such devices capable of stably and efficiently injecting an electric charge include a device comprising a positive-hole injecting layer having carbon black dispersed therein which layer is interposed between a type-P photoconductor layer and a supporting substrate (refer to Japanese Patent Application Laid-Open No. 12848/1984) and a device improved in charge injecting properties which comprises two divisional charge transporting layers, whose layer on the side of a charge generating layer is composed of a polymer layer having a distyryl compound dispersed therein (refer to Japanese Patent Application Laid-Open No. 157660/1991). However, the above-mentioned devices have been complicated in production because of the necessity of adding a new layer to the device.

In addition, there is disclosed an organic EL device technology which enhances a positive-hole injecting efficiency into an organic light-emitting layer by the use of a injecting layer comprising an aromatic tertiary amine (refer to Japanese Patent Application Laid-Open No. 295695/1988). Nevertheless the above-disclosed device does not fully satisfy electric power conversion efficiency and light-emitting efficiency. Thus, there is required an EL device capable of being driven by a lower voltage in order to enhance the power conversion efficiency and light-emitting efficiency of the device.

There is also disclosed an organic EL device technology which constitutes a light-emitting layer by mixing a styrylamine derivative being a positive-hole transporting material and also a light emitting material with an oxadiazole derivative being an electron transporting material (refer to Japanese Patent Application Laid-Open No. 250292/1990). However, the aforesaid technology relates to the incorporation of an oxadiazole derivative into a light emitting layer comprising a styrylamine to impart electron injecting properties to the layer, and discloses nothing about such function of a charge injection auxiliary material that improves charge injecting properties by adding a slight amount of a styrylamine to a light emitting layer (not being a styrylamine layer in most cases) or to an electron transporting layer.

There are known an EL device having an organic light-emitting layer in which 8-hydroxyquinoline aluminum complex as the host is doped with a slight amount of a fluorescent substance (refer to Japanese Patent Application Laid-Open No. 264692/1988) and an organic light-emitting layer in which 8-hydroxyquinoline aluminum complex as the host is doped with a quinacridone-based pigment (refer to Japanese Patent Application Laid-Open No. 255190/1991). Nevertheless, the above-mentioned dopants do not function as a charge injection auxiliary material.

DISCLOSURE OF THE INVENTION

Under such circumstances, intensive research and investigations were made by the present inventors in order to develop a charge injection auxiliary material capable of enhancing charge injecting properties by adding a slight amount thereof in a functional layer such as a light-emitting layer in an organic electron device. As a result, it has been found by the present inventors that a derivative of stilbene, distyrylarylene or tris(styrylarylene) each having an electron donating property is useful as a charge injection auxiliary material and that an organic electroluminescence device containing the aforesaid charge injection auxiliary material and having an energy gap in a light-emitting layer higher than that in said charge injection auxiliary material is lowered in applied voltage, enhanced in luminous efficiency and prolonged in service life. The present invention has been accomplished on the basis of the aforestated finding and information.

Specifically the present invention provides a charge injection auxiliary material for use in an organic electron device wherein a functional layer composed of a positive-hole transporting organic substance is subjected to positive-hole injection from an external layer by incorporating said material in said functional layer which material comprises a derivative of stilbene, distyrylarylene or tris(styrylarylene).

In addition, the present invention provides an organic electroluminescence device which comprises the above-mentioned charge injection auxiliary material and the light emitting layer characterized in that the ionization energy of the charge injection auxiliary material is smaller than the ionization energy of the light emitting layer.

BRIEF DESCRIPTION OF THE DRAWINGS

In FIG. 1, symbol 11 is a conduction level of the functional layer, symbol 12 is a valence level of the functional layer, symbol 13 is a valence level of the charge injection auxiliary material, and symbol 14 is a work function of anode or a valence level of the external layer. In FIG. 2, symbol 21 is a conduction level of the light emitting layer, symbol 22 is a valence level of the light emitting layer, symbol 23 is a valence level of the charge injection auxiliary material, symbol 24 is a work function of the anode, and symbol 25 is a work function of cathode.

THE MOST PREFERRED EMBODIMENT TO CARRY OUT THE INVENTION

The charge injection auxiliary material according to the present invention is employed for the purpose of enhancing the charge injecting properties at the same electric field strength and injecting a larger amount of charge in the case where positive holes are injected from an external layer into a charge-transporting functional layer. The amount of the charge injection auxiliary material to be added in the functional layer comprising an organic substance is preferably 19% or less by weight, particularly preferably 0.05 to 9% by weight based on the weight of the functional layer.

Accordingly, a charge injection auxiliary material is distinguished from a charge transporting material, namely a charge transporting material in a photosensitive body, a light emitting material in an organic EL device, a semiconductor in an organic transistor, and is a material used for the purpose of enhancing charge injecting properties by being adding in the above-mentioned functional layer comprising a charge transporting material as the principal component thereof.

In addition, the term "functional layer" signifies a layer which preserves the function of transporting or injecting positive holes and is exemplified by a positive-hole injecting layer, a positive-hole transporting layer, a light emitting layer and an electron barrier layer.

In the following, the function of the charge injection auxiliary material will be described with reference to FIG. 1.

Figure 1:
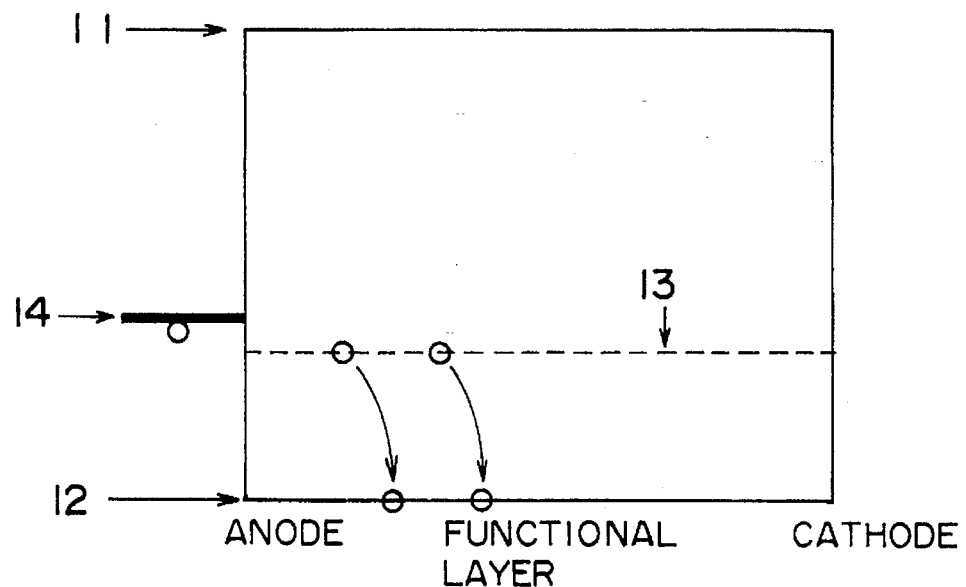
FIG. 1 is a schematic illustration showing the energy level in an organic electron device.

FIG. 1 is a schematic illustration showing the energy level in an organic electron device. In the case where positive holes are injected from the energy level 14 to the energy level 12, the energy level barrier due to the difference between the energy levels 12 and 14 must be surmounted. When the charge injection auxiliary material having an energy level 13 is added in the functional layer, positive holes are more easily injected at the energy level 13, and the movement of positive holes to the level 12 takes precedence over the movement thereof within the level 13, since a slight amount of the charge injection auxiliary material is already dispersed in the functional layer. Thereby the charge injecting properties are enhanced. The charge injection auxiliary material according to the present invention is excellent in charge injection auxiliary function.

The stilbene derivative to be used as the charge injection auxiliary material according to the present invention is a compound in which at least two aromatic rings are bonded by way of a vinyl group or a substituted vinyl group, and any of the aforementioned aromatic rings and vinyl group bears an electron donating group.

The distyrylarylene derivative is a compound in which two aromatic rings are bonded to one arylene group each by way of a vinyl group or a substituted vinyl group, and an electron donating group is contained.

In addition, the tris(styrylarylene) derivative is a compound in which three aromatic rings are bonded to one trivalent aromatic ring radical by way of a vinyl group or a substituted vinyl group, and an electron donating group is contained.

In the above-mentioned derivative containing an electron donating group in its molecular skeleton, the electron donating group is exemplified preferably by an alkoxy group having 1 to 10 carbon atoms, an aryloxy group having 6 to 10 carbon atoms and an amino group with a hydrocarbon radical having 1 to 30 carbon atoms.

The particularly preferable derivatives in the present invention are the compounds represented by any of the following general formulae (I) to (VII), wherein (I) and (II) stand for a stilbene derivative, (III) and (IV) denote a distyrylarylene derivative, and (V) to (VII) indicate a tris-(styrylarylene) derivative.

wherein $Ar^1$ is an aryl group having 6 to 20 carbon atoms, a thienyl group or a bithienyl group, $R^1$ to $R^4$ are each a hydrogen atom, an aryl group having 6 to 20 carbon atoms, a thienyl group or a bithienyl group, $R^1$ and $R^2$, and $R^3$ and $R^4$ may each be same or different, respectively, $D^1$ to $D^3$ are each an aryl group having 6 to 20 carbon atoms which is substituted with an electron donating group, a thienyl group or a bithienyl group or a condensed polycyclic group having 10 to 30 carbon atoms, $D^2$ and $D^3$ may be same or different, and $Ar^1$ and $R^1$ to $R^4$ may each be unsubstituted or substituted with an alkyl group having 1 to 10 carbon atoms, an alkoxy group having 1 to 10 carbon atoms, an aryloxy group having 6 to 10 carbon atoms, an arylalkyl group having 7 to 10 carbon atoms or an amino group with a hydrocarbon radical having 1 to 20 carbon atoms.

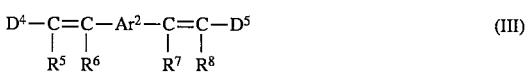

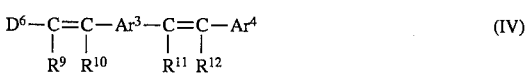

wherein $Ar^2$ and $Ar^3$ are each an arylene group having 6 to 20 carbon atoms, a thienylene group or a bithienylene group, $Ar_4$ is an aryl group having 6 to 20 carbon atoms, a thienyl group or a bithienyl group, $R^5$ to $R^{12}$ are each a hydrogen atom, an aryl group having 6 to 20 carbon atoms, a thienyl group or a bithienyl group, $R^5$ to $R^8$; and $R^9$ to $R^{12}$ may each be same or different, respectively, $D^4$ to $D^6$ are each an aryl group having 6 to 20 carbon atoms which is substituted with an electron donating group, a thienyl group or a bithienyl group or a condensed polycyclic group having 10 to 30 carbon atoms, $D^4$ and $D^5$ may be same or different, and $Ar^2$ to $Ar^4$ and $R^5$ to $R^{12}$ may each be unsubstituted or substituted with an alkyl group having 1 to 10 carbon atoms, an alkoxy group having 1 to 10 carbon atoms, an aryloxy group having 6 to 10 carbon atoms, an arylalkyl group having 7 to 10 carbon atoms or an amino group with a hydrocarbon radical having 1 to 20 carbon atoms.

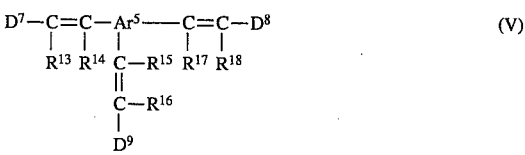

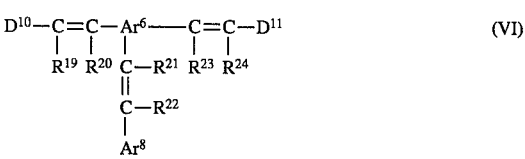

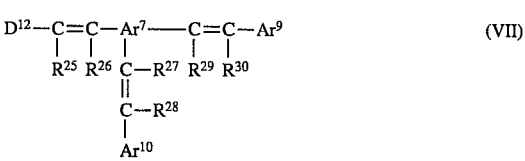

wherein $Ar^5$ to $Ar^7$ are each a trivalent aromatic ring radical having 6 to 24 carbon atoms, $Ar^8$ to $Ar^{10}$ are each an aryl group having 6 to 20 carbon atoms, a thienyl group or a bithienyl group, $Ar^9$ and $Ar^{10}$ may be same or different, $R^{13}$ to $R^{30}$ are each a hydrogen atom, an aryl group having 6 to 20 carbon atoms, a thienyl group or a bithienyl group, $R^{13}$ to $R^{18}$; $R^{19}$ to $R^{24}$; and $R^{25}$ to $R^{30}$ may be each same or different, respectively, $D^7$ to $D^{12}$ are each an aryl group having 6 to 20 carbon atoms which is substituted with an electron donating group, a thienyl group or a bithienyl group or a condensed polycylic group having 10 to 30 carbon atoms, $D^7$ to $D^9$, $D^{10}$ and $D^{11}$ may be same or different, and $Ar^5$ to $Ar^{10}$ and $R^{13}$ to $R^{30}$ may be each unsubstituted or substituted with an alkyl group having 1 to 10 carbon atoms, an alkoxy group having 1 to 10 carbon atoms, an aryloxy group having 6 to 10 carbon atoms, an arylalkyl group having 7 to 10 carbon atoms or an amino group with a hydrocarbon radical having 1 to 20 carbon atoms.

The aryl group having 6 to 20 carbon atoms in the above-mentioned general formulae (I) to (VII) is exemplified preferably by a phenyl group, biphenylyl group, naphthyl group, pyrenyl group, terphenylyl group, anthranyl group, tolyl group, xylyl group and monovalent group comprising stilbene.

The arylene group having 6 to 20 carbon atoms therein is exemplified preferably by a phenylene group, biphenylene group, naphthylene group, anthranylene group, terphenylene group, pyrenylene group and divalent group comprising stilbene.

The trivalent aromatic ring radical having 6 to 24 carbon atoms is exemplified preferably by the following groups:

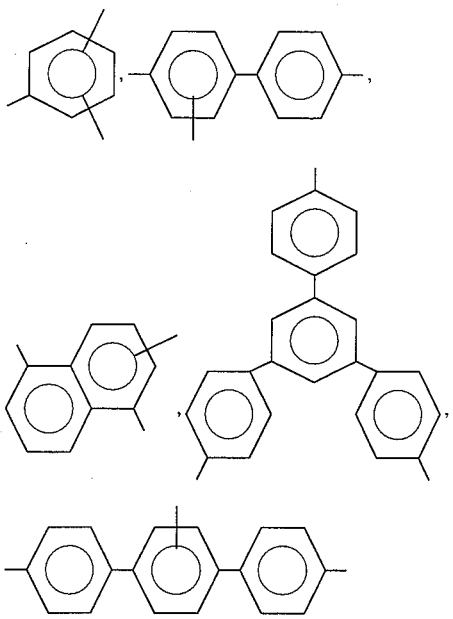

Examples of the aryloxy group having 6 to 20 carbon atoms as the above-mentioned substituent include a phenyloxy group, and biphenyloxy group, naphthyloxy group, anthranyloxy group, terphenyloxy group and pyrenyloxy group; examples of the alkyl group having 1 to 10 carbon atoms include a methyl group, ethyl group, isopropyl group, tert-butyl group, pentyl group and hexyl group; examples of the alkoxy group having 1 to 10 carbon atoms include a methoxy group, ethoxy group, isopropoxy group, tert-butoxy group and pentyloxy group; and examples of the amino group with a hydrocarbon radical having 1 to 20 carbon atoms include a dimethylamino group, diethylamino group, diphenylamino group, phenylethylamino group, phenylmethylamino group, ditolylamino group, ethylphenylamino group, phenylnaphthyl amino group and phenylbiphenylamino group.

The $D^1$ to $D^2$ in the above-mentioned general formulae (I) to (VII) are each an aryl group having 6 to 20 carbon atoms which is substituted with an electron donating group, a thienyl group or a bithienyl group or a condensed polyoylic group having 10 to 30 carbon atoms. The electron donating group as mentioned herein is exemplified preferably by an alkoxy group having 1 to 10 carbon atoms, an aryloxy group having 6 to 20 carbon atoms, particularly preferably by an amino group with a hydrocarbon radical having 1 to 30 carbon atoms. The aforesaid amino group can be exemplified by the group represented by the general formula

wherein $X^1$ to $X^2$ are each an alkyl group having 1 to 10 carbon atoms, an aryl group having 6 to 20 carbon atoms, a thienyl group, a bithienyl group or an arylalkyl group having 7 to 20 carbon atoms and may be same or different and be bonded to each other to form a saturated or unsaturated cyclic structure, and they may be a substituted alkyl group having 1 to 10 carbon atoms, a substituted alkoxy group having 1 to 10 carbon atoms, a substituted aryloxy group having 6 to 10 carbon atoms or a substituted arylalkyl group having 7 to 10 carbon atoms.

Preferable examples of the above-mentioned electron donating group include an alkoxy group or aryloxy group such as phenyoxy group, biphenyloxy group, naphthyloxy group, anthranyloxy group, terphenylyloxy group, methoxy group, ethoxy group, isopropoxy group, tert-butyloxy group and pentyloxy group, and an amino group having a hydrocarbon radical such as dimethylamino group, diethylamino group, diphenylamino group, phenylmethylamino group, phenylethylamino group, phenylmethylethylamino group, ditolylamino group, ethylphenylamino group, phenylnaphthylamino group and phenylbiphenylylamino group. Specific examples of the $D^1$ to $D^{12}$ include the following:

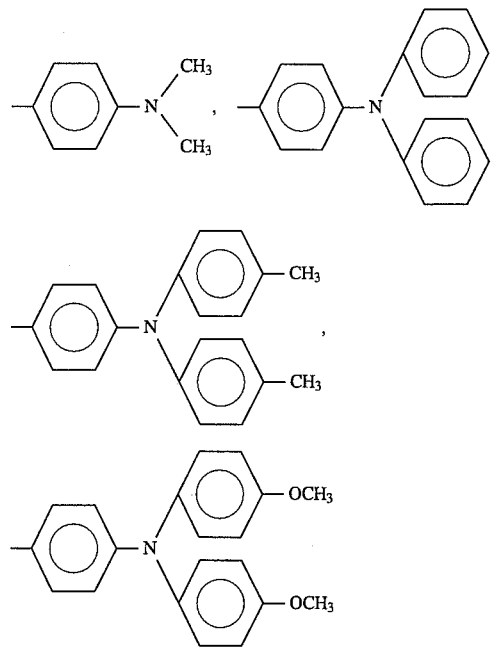

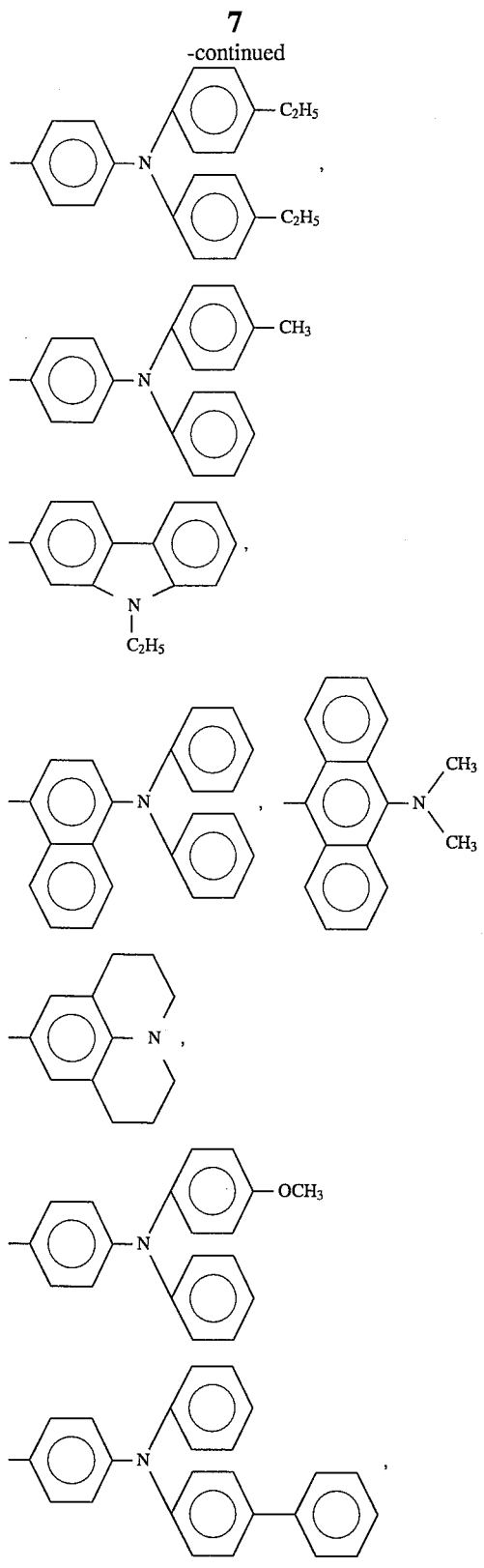
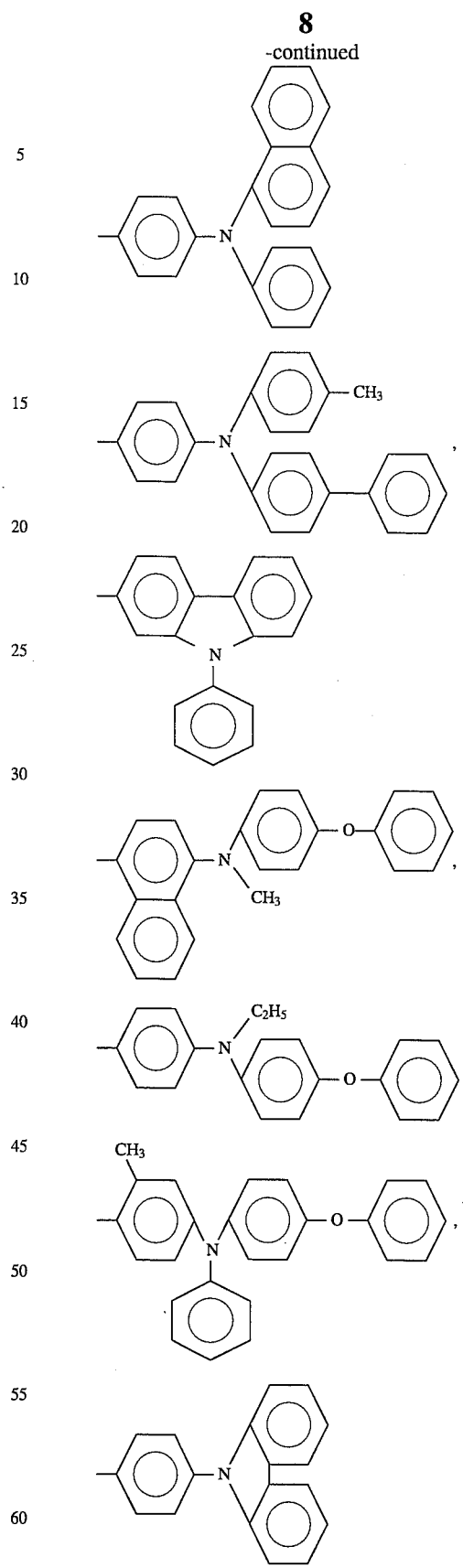

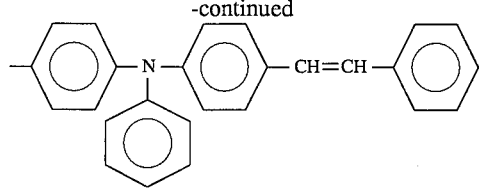
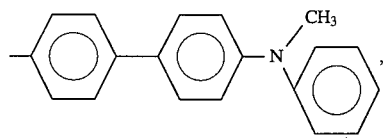
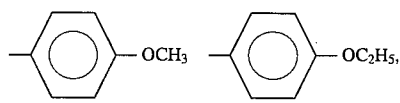
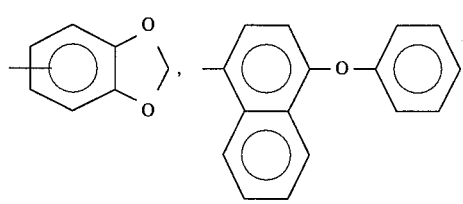
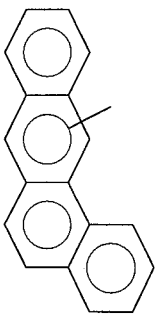
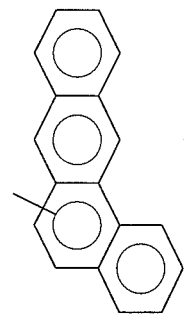
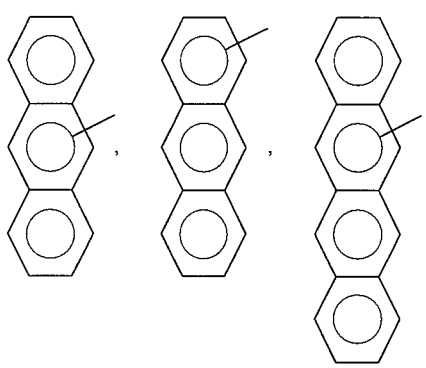
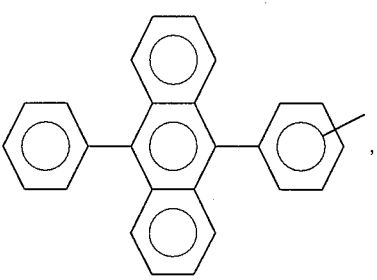
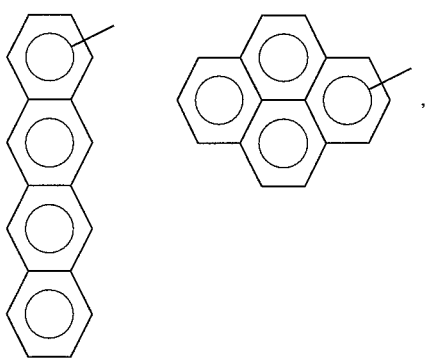
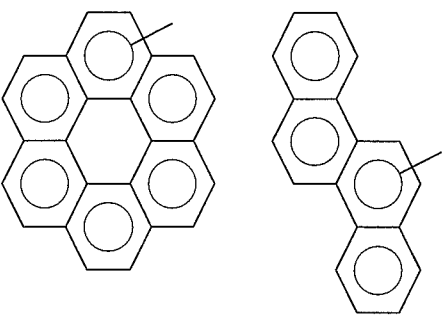
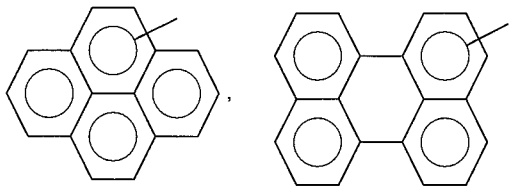
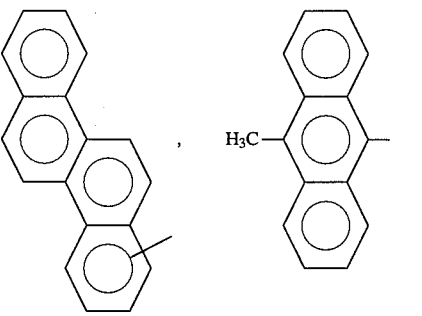
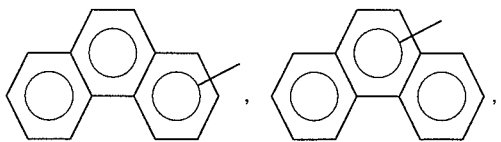

-continued
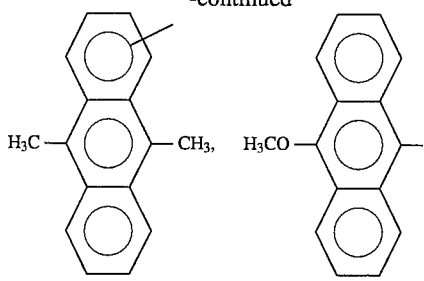
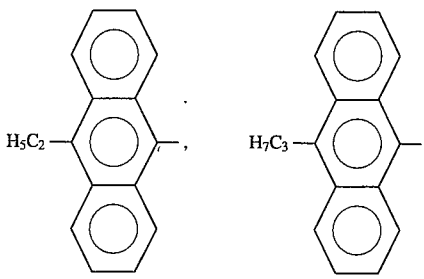
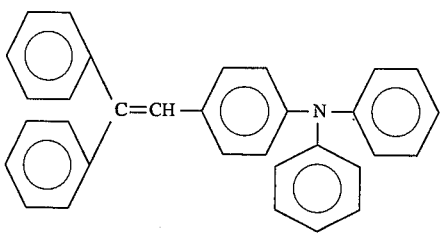
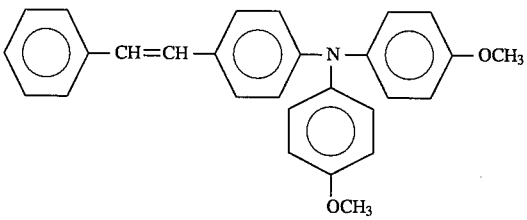
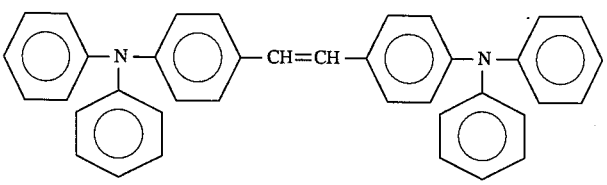
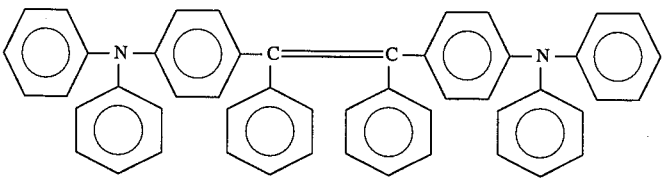
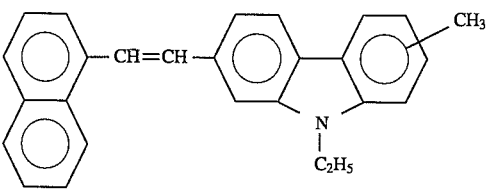
Specific examples of the compound represented by any of the general formulae (I) to (VII) include the following:

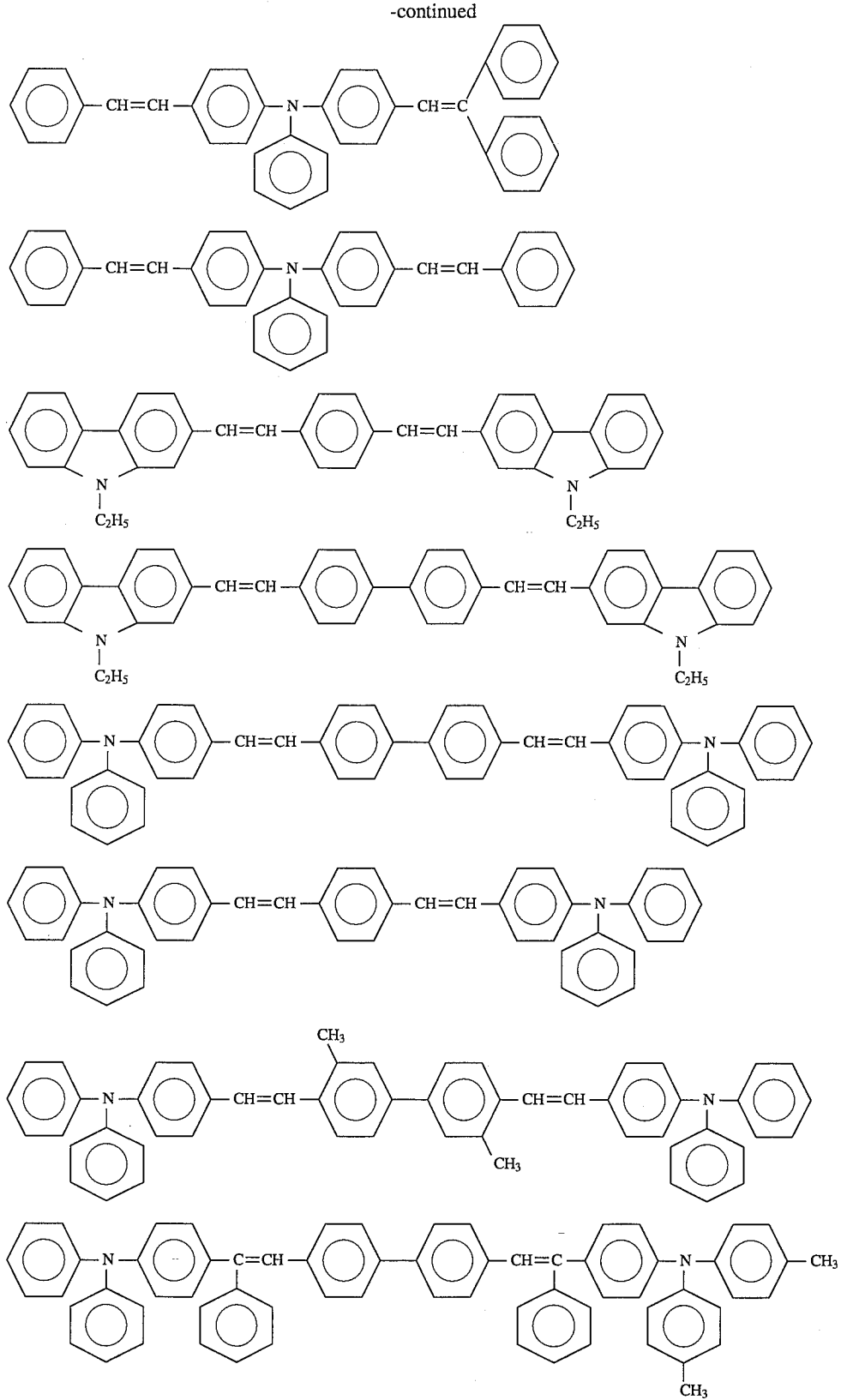

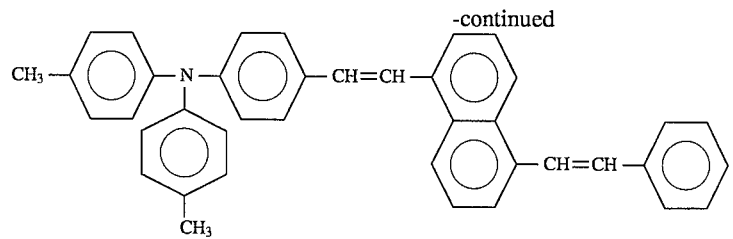
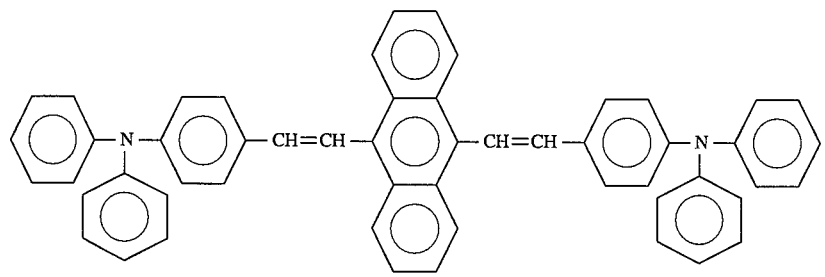
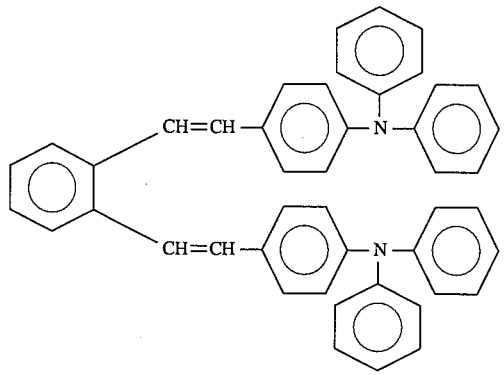
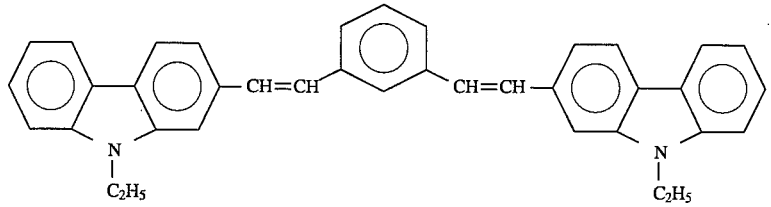
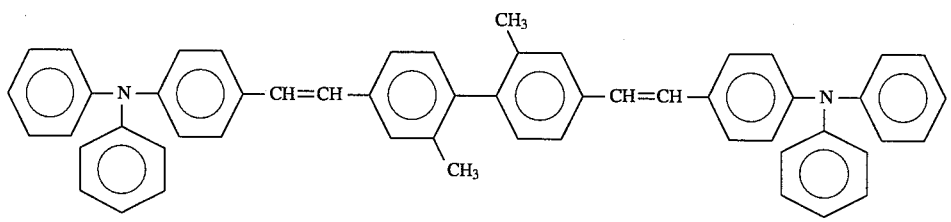
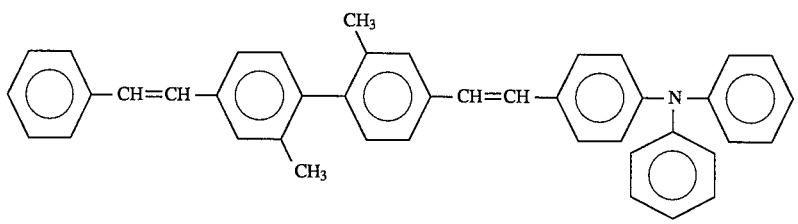

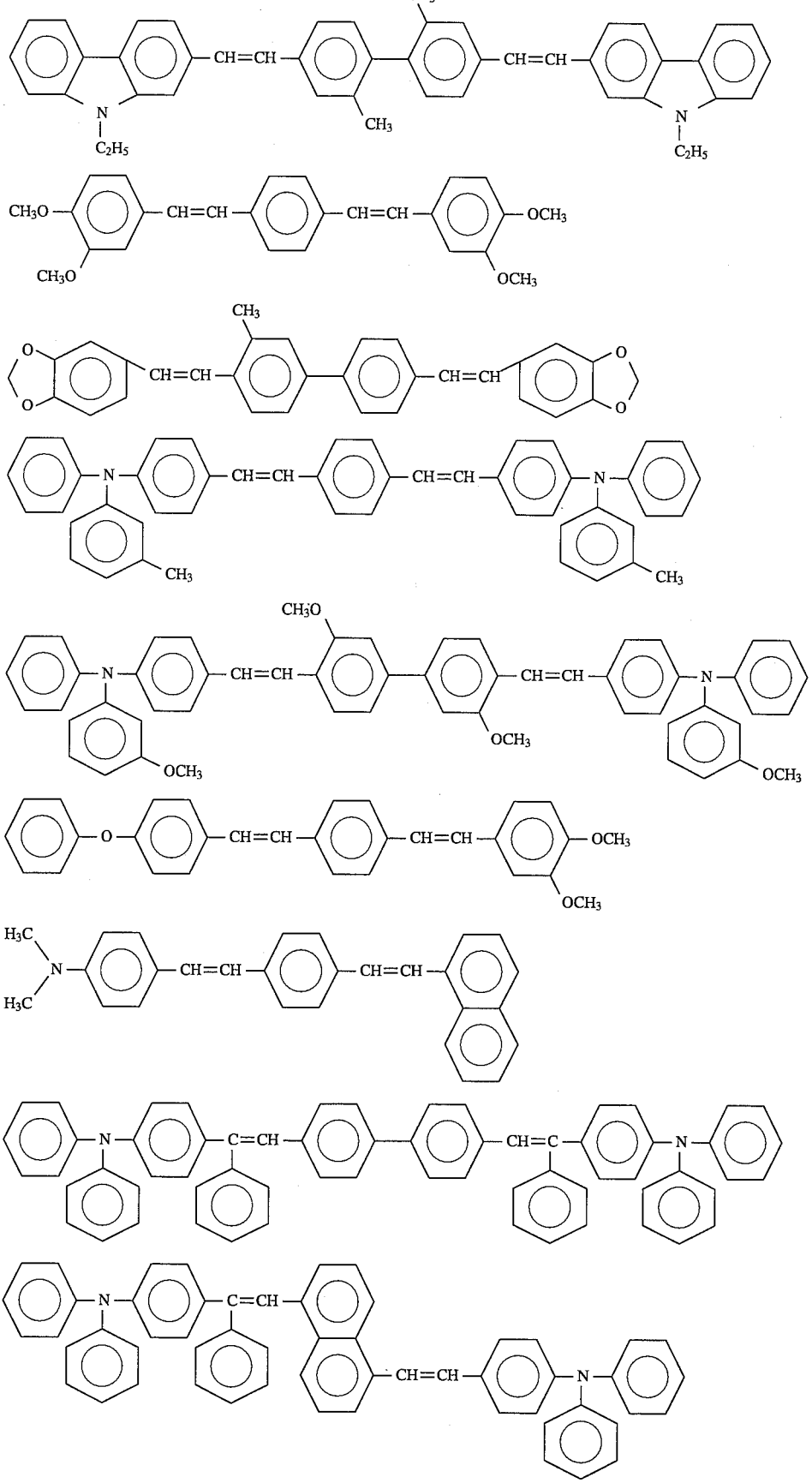

-continued
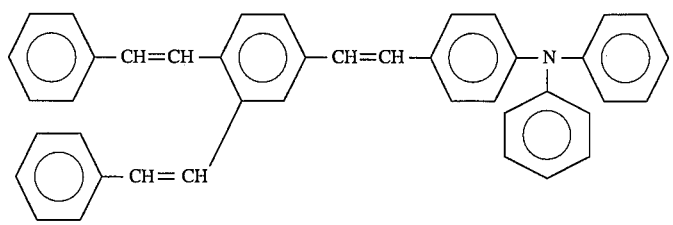
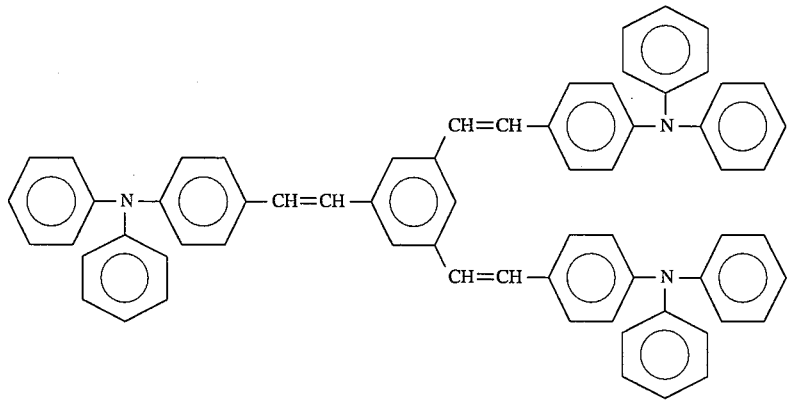
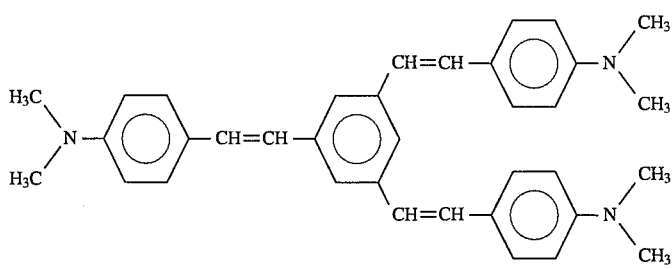
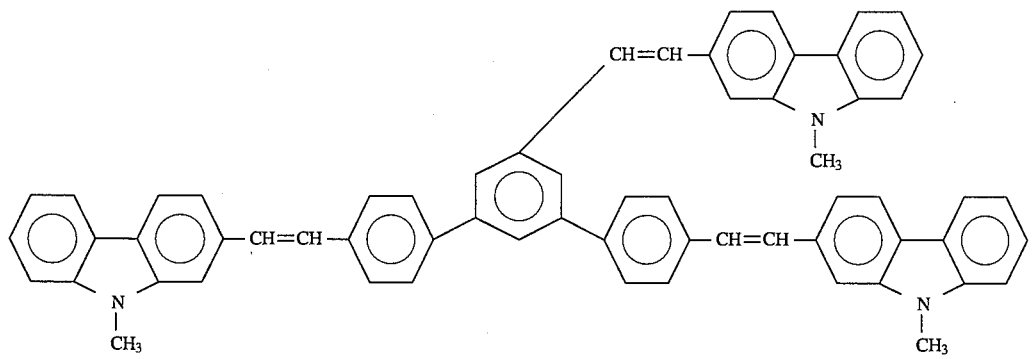
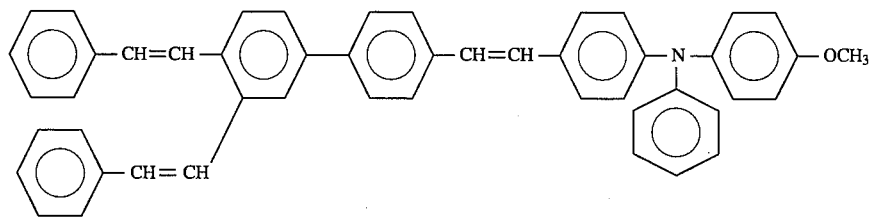
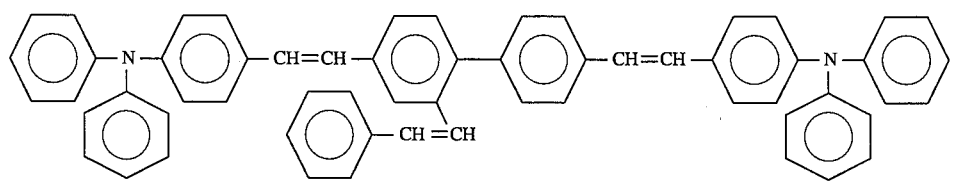

-continued
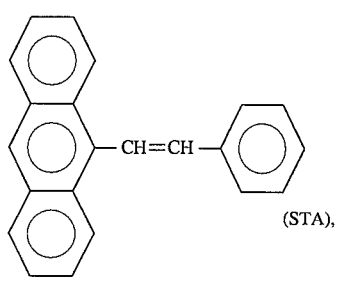
(STA),
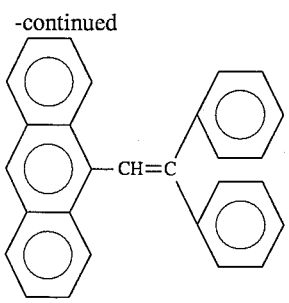
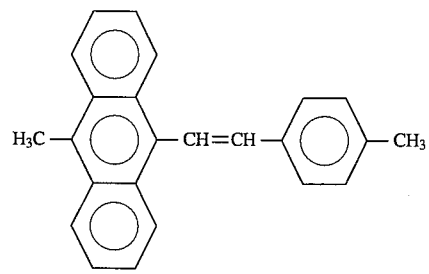
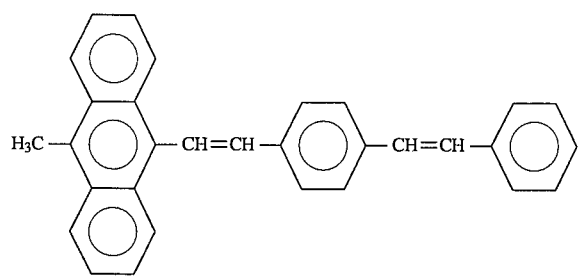
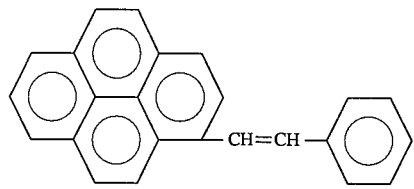
(STPy)
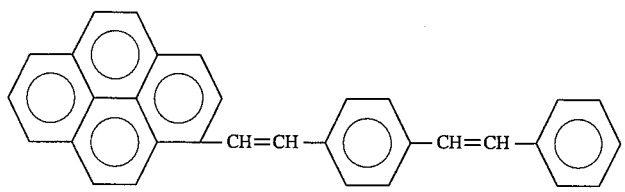
(STSTPy)
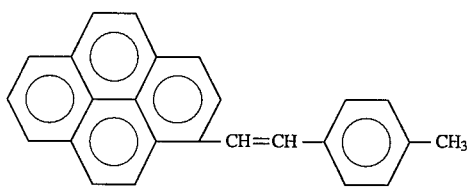
(MeSTPy)

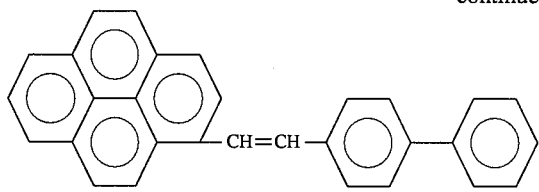
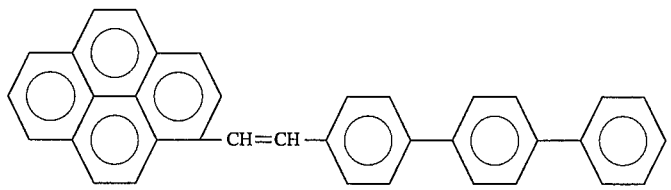
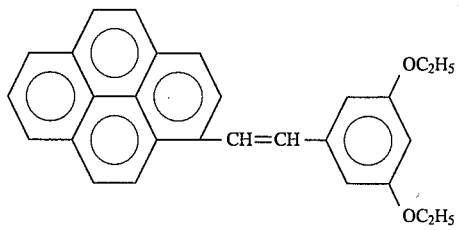
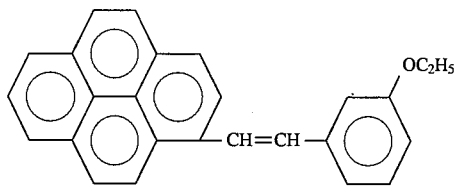
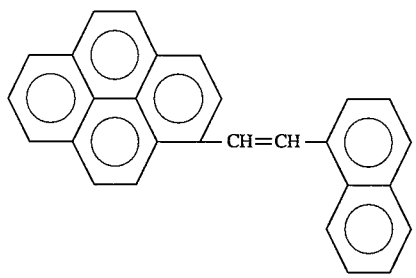
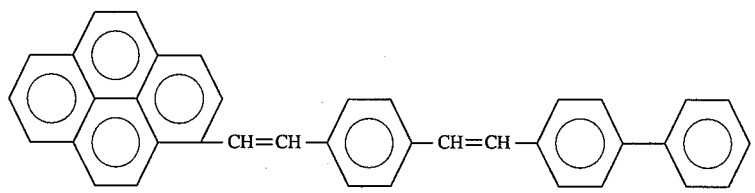
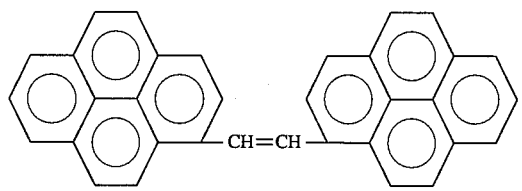

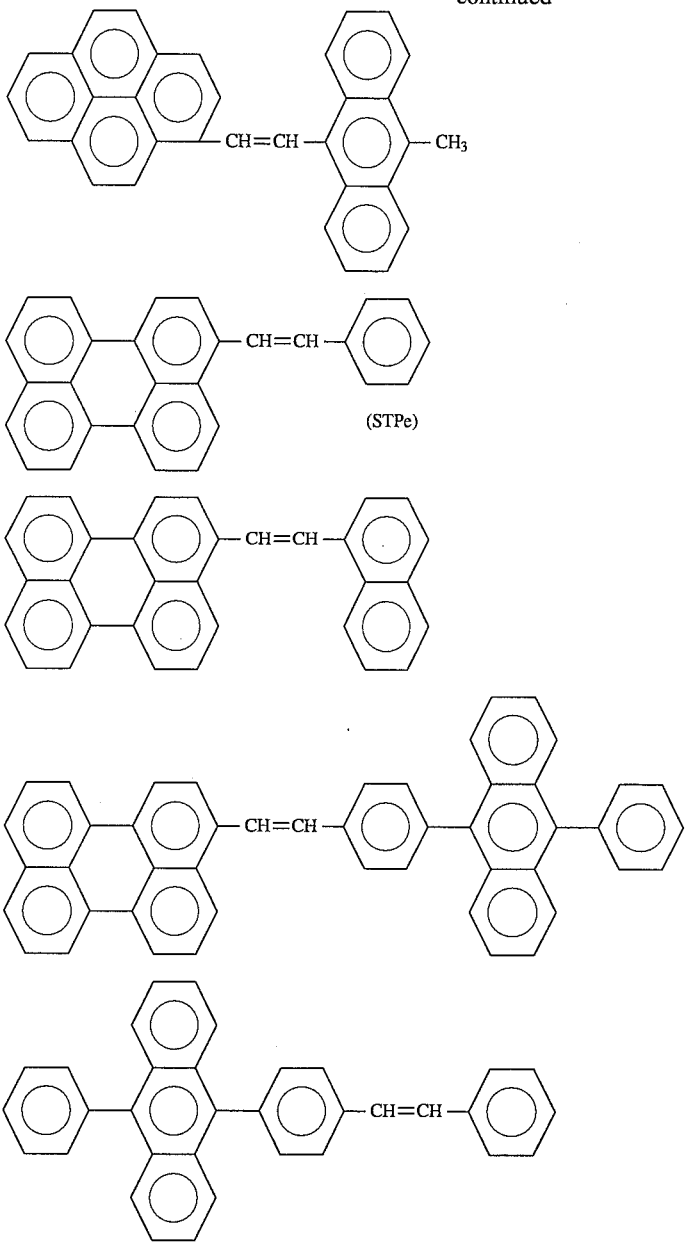

Particularly preferable compound among the charge injection auxiliary materials represented by any of the general formulae (I) to (VII) is the distyrylarylene derivative represented by any of the general formulae (III) and (IV), which has a remarkable charge injection assistant function.

Figure 2:
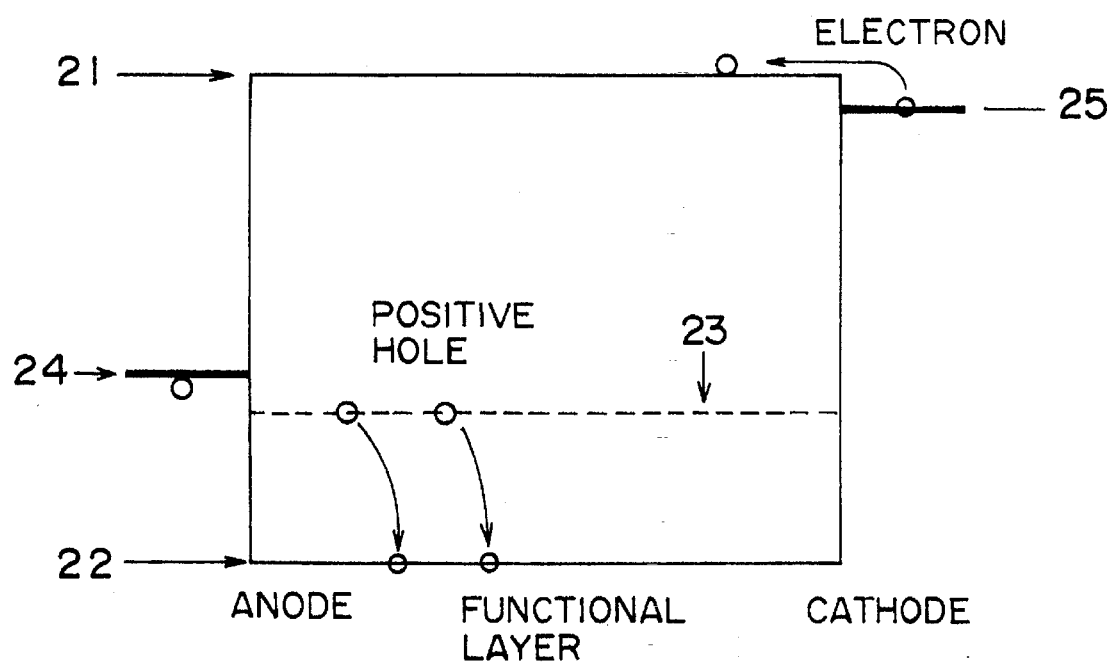
FIG. 2 is a schematic illustration showing the energy level in an organic electroluminescence device.

In the following, the principle of the charge injection auxiliary material when applied to an organic EL device will be described with reference to FIG. 2, which is an energy level drawing prepared for describing the principle of the charge injection auxiliary material in the organic EL device comprising an anode/a light emitting layer/a cathode.

Positive holes among the charges are injected, under applied electric field at the valence electron level 23 of the charge injection auxiliary material, since it is easier than the injection at the valence level of the light emitting layer. Then, the positive holes try to move towards the cathode at the valence level of the charge injection auxiliary material, but are injected at the valence level of the light emitting layer because of a large intermolecular distance in the charge injection auxiliary material. The positive holes, when arrive at the valence level of the light emitting layer, move at the valence level and recombine with the electrons moving at the conduction level injected from the cathode.

It is understood from the description that the charge injection auxiliary material according to the present invention makes it easy to inject the positive holes in the light emitting layer usually at an energy lower than the ionization energy of the light emitting layer.

Some of the charge injection auxiliary material has an energy gap smaller than that of the light emitting layer. In such a case, the excited state formed by the charge which has rejoined in the light emitting layer is transferred to the charge injection auxiliary layer.

Since the charge injection auxiliary material which has been dispersed in a slight amount according to the present invention has a high fluorescence yield, the quantum yield of the EL device using the charge injection auxiliary material according to the present invention is sometimes doubled or more.

As mentioned hereinbefore, the charge injection auxiliary material not only enables a decrease in applied voltage and improvement in quantum yield but also exhibits a surprisingly remarkable effect on the stabilization of voltage as well as the brightness of the EL device.

The point to which special attention should be paid is that the charge injection auxiliary material is added preferably in a slight amount in order to facilitate the movement at the valence level.

With regard to the organic EL device utilizing the above-mentioned charge injection auxiliary material, the following structures are possible in addition to the aforesaid structure.

(1) Anode/positive-hole injecting layer/light emitting layer/cathode (2) Anode/positive-hole injecting layer/light emitting layer/electron injecting layer/cathode (3) Anode/light emitting layer/electron injecting layer/cathode (4) Anode/organic semiconductor layer/light emitting layer/cathode (5) Anode/organic semiconductor layer/electron barrier layer/light emitting layer/cathode (6) Anode/positive-hole injecting layer/light emitting layer/adhesion improving layer/cathode The objective device can be obtained by adding the charge injection auxiliary material according to the present invention in the above-mentioned light emitting layer, positive-hole injecting layer or organic semiconductor layer.

In the aforestated device structure, the charge injection auxiliary material has a molecular structure similar to that in the light emitting layer (the host substance in the light emitting layer), as the case may be, but the similar molecular structure does not cause any problem. It is preferable that the host material occupies 81% or more by weight of the light emitting material, and the charge injection auxiliary material occupies 19% or less by weight of the light emitting material, particularly preferably in the range of 0.5 to 5% by weight based thereon. In addition, it is particularly preferable that the ionization energy of the charge injection auxiliary material be lower than that of the light emitting material.

Moreover, it is particularly preferable that the difference in the ionization energy between the light emitting material and the charge injection auxiliary material be not less than 0.1 eV.

The charge injection auxiliary material according to the present invention functions as a fluorescent dopant in addition to the charge injection assistant effect. By the term fluorescent dopant is meant a substance which emits light in response to the recombining of positive holes and electrons in the region consisting of the host material.

The present invention also provides an organic EL device which comprises the above-mentioned charge injection auxiliary material and the light emitting material having an energy gap more than the energy gap of said charge injection auxiliary material. It is preferable in said organic EL device that the energy gap of the charge injection auxiliary material be less than the energy gap of the light emitting layer by 0.1 eV or more. The suitable organic EL device is such that emits light by being excited through the recombination of positive holes and electrons in the light emitting layer. Such organic EL device according to the present invention is characterized by lowered applied voltage, enhanced luminous efficiency and prolonged service life.

The charge injection auxiliary material according to the present invention is added in the functional layer of the organic electron device. In the case where the organic electron device is an organic EL device, said functional layer is a positive-hole injecting layer or a light emitting layer in the above-mentioned structures (1), (2) and (6); a light emitting layer in the structure (3); an organic semiconductor layer or a light emitting layer in the structure (4); and an organic semiconductor layer, an electron barrier layer or a light emitting layer in the structure (5).

The light emitting layer in the aforestated organic EL device, as is the case with an ordinary light emitting layer, possesses an injecting function (it is capable of injecting positive holes from an anode or positive hole injecting layer and besides injecting electron from a cathode or electron injecting layer at the time of voltage being applied); a transporting function (it is capable of moving positive hole and electrons by an electric field force); and a light emitting function (it is capable of providing the rejoining field of positive holes and electrons, thereby emitting light). The thickness of the functional layer can be determined suitably according to the conditions without specific limitation, and is preferably 1 nm to 10 μm, particularly preferably 5 nm to 5 μm.

As the preferable light emitting material (host material), mention can be made of the compound represented by the general formula (IX)

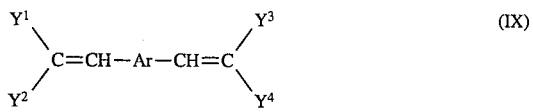

wherein $Y^1$ to $Y^4$ indicate each a hydrogen atom, an alkyl group having 1 to 6 carbon atoms, an alkoxyl group having 1 to 6 carbon atoms, an aralkyl group having 7 to 8 carbon atoms, a substituted or unsubstituted aryl group having 6 to 18 carbon atoms, a substituted or unsubstituted cyclohexyl group, a substituted or unsubstituted aryloxyl group having 6 to 18 carbon atoms, or an alkoxyl group having 1 to 6 carbon atoms; therein, the substituent is an alkyl group having 1 to 6 carbon atoms, an alkoxyl group having 1 to 6 carbon atoms, an aralkyl group having 7 to 8 carbon atoms, an aryloxy group having 6 to 18 carbon atoms, an acyl group having 1 to 6 carbon atoms, an acyloxy group having 1 to 6 carbon atoms, a carboxyl group, a styryl group, an arylcarbonyl group having 6 to 20 carbon atoms, an aryloxycarbonyl group having 6 to 20 carbon atoms, an alkoxycarbonyl group having 1 to 6 carbon atoms, a vinyl group, an anilinocarbonyl group, a carbamoyl group, a phenyl group, a nitro group, a hydroxyl group or a halogen; these substituents may be used solely or in plural; $Y^1$ to $Y^4$ may be identical to or different from one another, and $Y^1$ and $Y^2$ and $Y^3$ and $Y^4$ may combine with groups substituting each other to form a substituted or unsubstituted saturated five-membered ring or a substituted or unsubstituted saturated six-membered ring; Ar indicates a substituted or unsubstituted arylene group having 6 to 20 carbon atoms, which may be mono-substituted or poly-substituted, and in which its bonding position may be any of ortho-, para- and meta-; however, when Ar is an unsubstituted phenylene, $Y^1$ to $Y^4$ is each selected from the group consisting of an alkoxyl group having 1 to 6 carbon atoms, an aralkyl group having 7 to 8 carbon atoms, a substituted or unsubstituted naphthyl group, a biphenyl group, a cyclohexyl group, and an aryloxy group, general formula (X):

wherein A and B indicate each a monovalent group which is obtained by removing a hydrogen atom from the compound represented by the above general formula (IX), and may be identical to or different from each other; Q indicates a divalent group breaking the conjugation, or general formula (XI)

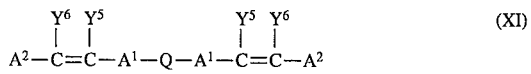

wherein $A^1$ indicates a substituted or unsubstituted arylene group having 6 to 20 carbon atoms or a divalent aromatic heterocyclic group; its bonding position may be any of ortho-, meta- and para-; $A^2$ is a substituted or unsubstituted aryl group having 6 to 20 carbon atoms or a monovalent aromatic heterocyclic group; $Y^5$ and $Y^6$ indicate each a hydrogen atom, a substituted or unsubstituted aryl group having 6 to 20 carbon atoms, a cyclohexyl group, a monovalent aromatic heterocyclic group, an alkyl group having 1 to 10 carbon atoms, an aralkyl group having 7 to 20 carbon atoms or an alkoxyl group having 1 to 10 carbon atoms; $Y^5$ and $Y^6$ may be identical to or different from each other; the mono-substituent therein is an alkyl group, an aryloxy group, an amino group or a phenyl group with or without a substituent; each substituent of $Y^5$ may combine with $A^1$ to form a saturated or unsaturated five-membered ring or six-membered ring, and similarly each substituent of $Y^6$ may combine with $A^2$ to form a saturated or unsaturated five-membered ring or six-membered ring; Q indicates a divalent group breaking a conjugation, The symbol Q in the general formulae (X) and (XI) indicates a divalent group breaking a conjugation. The conjugation therein is attributable to the delocalization of π-electron, and includes a conjugated double bond or a conjugation due to an unpaired electron or a lone electron-pair. Specific examples of Q include

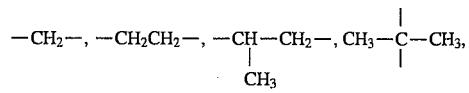

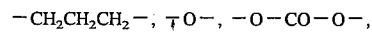

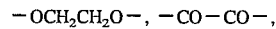

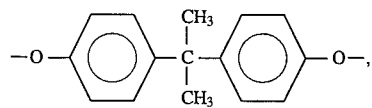

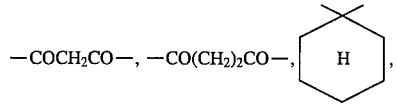

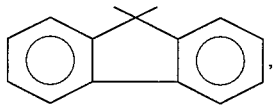

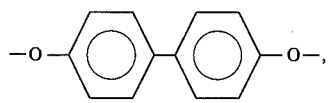

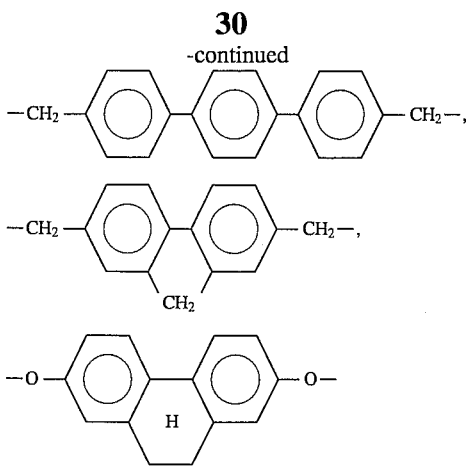

The divalent group breaking the conjugation is thus used in order that EL emission light obtained when the compound forming A or B shown in above (that is, the compound of general formula (IX)) is used solely as the organic EL device of the present invention and the EL emission light obtained when the compound represented by general formula (X) is used as the organic EL device of the present invention may be identical in color. In other words, said divalent group is used so that the wavelength of the light emitting layer using the compound represented by general formula (IX) or general formula (X) may not be changed to shortened or lengthened. By combining with a divalent group to break conjugation, it is confirmed that the glass transition temperature (Tg) rises, and uniform pinhole free minute crystal or amorphous thin film can be obtained, improving the uniformity of light emission. Further, combining with a divalent group breaking the conjugation brings about advantages that EL emission is not long-wavened, and synthesis or purification can easily be effected.

As another preferable light emitting material (host material), mention can be made of a metal complex of 8-hydroxyquinoline or derivative thereof. Specific examples of them include metal chelated oxinoide compound containing a chelate of oxine (generally, 8-quinolinol or 8-hydroxyquinoline). Such compound exhibits a high level performance, and is easy to be formed into a thin film. Examples of the oxinoide compounds satisfy the following structural formula.

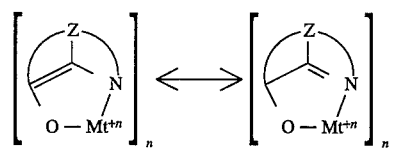

wherein Mt indicates a metal, n is an integer of 1 to 3, and Z indicates an atom required to complete at least two condensed aromatic ring, being located independently.

Therein the metal represented by Mt is a monovalent, divalent or trivalent metal, that is, an alkali metal such as lithium, sodium or potassium, an alkaline earth metal such as magnesium or calcium, or an earth metal such as boron or aluminum.

Generally any of monovalent, divalent and trivalent metals which are known to be useful chelated compounds can be used therein.

Z indicates an atom to form a hetero ring comprising azole or azine as one of at least two condensed aromatic rings. Herein, if necessary, another ring can be added to the above-mentioned condensed aromatic ring. Moreover, in order to avoid adding bulky molecules without improvement in function, the number of the atoms shown by Z is preferably kept to not more than 18.

Further, specific examples of the chelated oxinoide compounds include tris(8-quinolinol)aluminum, bis(8-quinolinol) magnesium, bis(benzo-8-quinolinol)zinc, bis(2-methyl-8-quinolato)aluminum oxide, tris(8-quinolinol)indium, tris(5-methyl- 8-quinolinol)aluminum, 8-quinolinol lithium, tris(5-chloro- 8-quinolinol)gallium, bis(5-chloro-8-quinolinol)calcium, tris(5,7-dichloro-8-quinolinol)aluminum and tris(5,7-dibromo-8-hydroxyquinolinol)aluminum.

The above-mentioned light emitting layer can be prepared by forming the above compound into a thin film by a known method such as the vapor deposition method, the spin-coating method, the casting method or the LB method, and particularly, a molecular accumulated film is preferable. A molecular accumulated film therein is a thin film formed by depositing said compound from a gaseous state, or a thin film formed by solidification of said compound from a molten state. Usually, said molecular accumulated film is distinguished from a thin film (molecular built-up film) formed by the LB method by the difference in the aggregation structure or the higher-order structure, or the functional difference resulting therefrom.

The above-mentioned light emitting layer can be formed by dissolving a binding agent such as a resin and said compound in a solvent to prepare solution, which is formed into a thin film by the spin-coating method or the like.

The film thickness of the light emitting layer thus formed is not particularly limited, but can be determined appropriately according to the circumstances. Usually, it is preferably in the range of 1 nm to 10 μm, particularly preferably 5 nm to 5 μm.

Herein examples of compounds represented by any of the aforesaid general formulae (IX) to (XI) to be used as the above-mentioned light emitting layer are shown as follows.

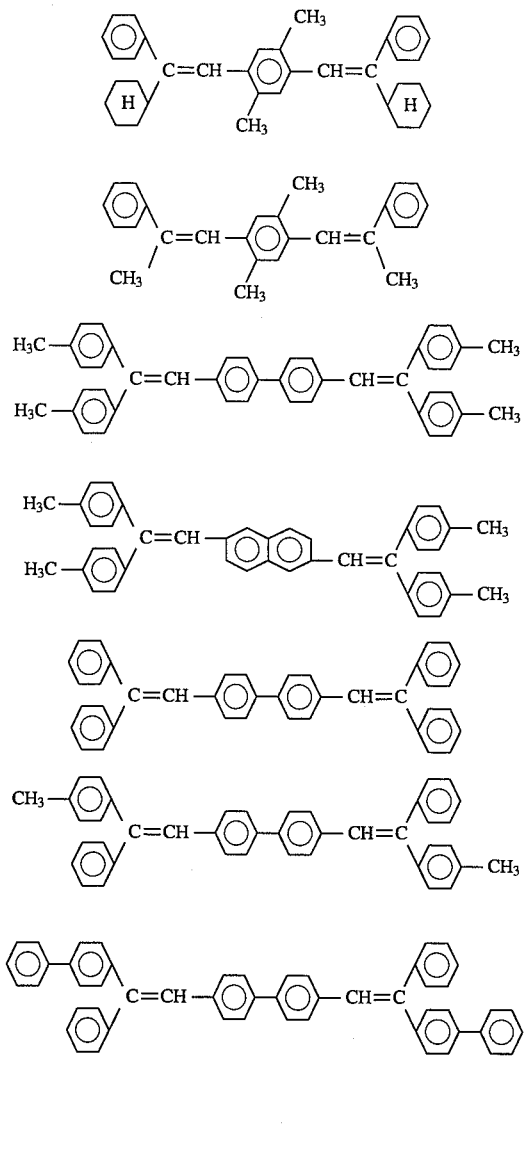

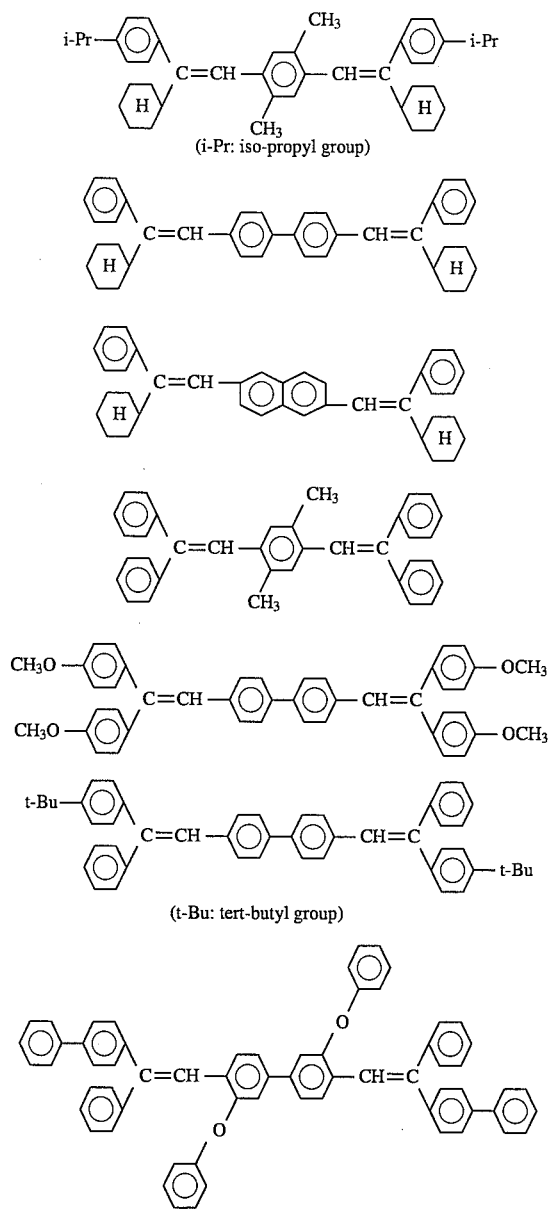

(i-Pr: iso-propyl group)

(t-Bu: tert-butyl group)

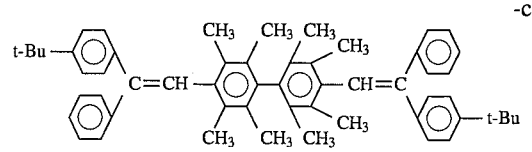
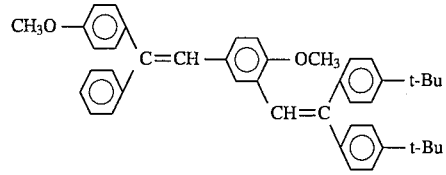
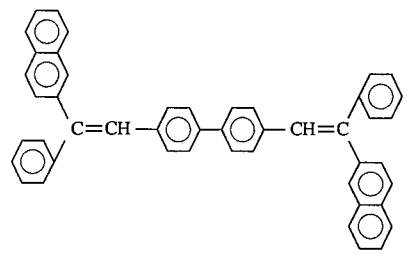
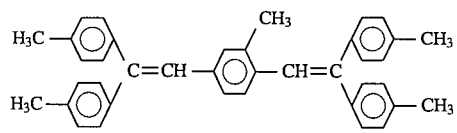
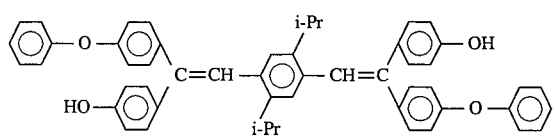
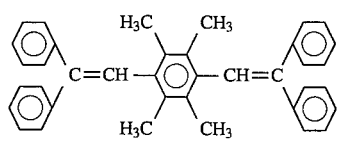
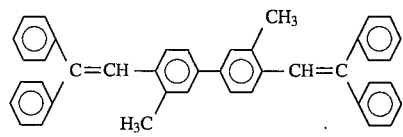
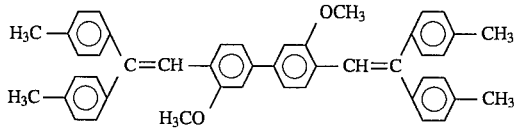
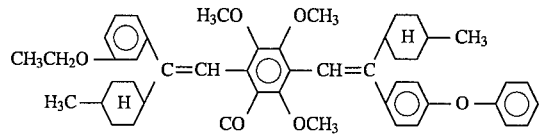
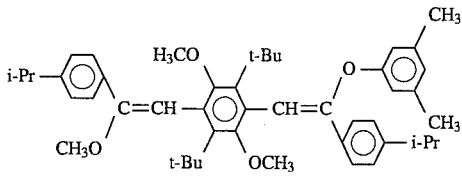
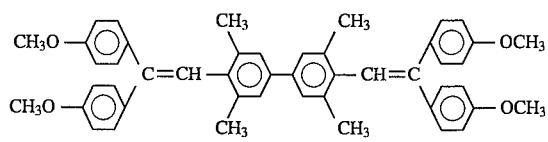
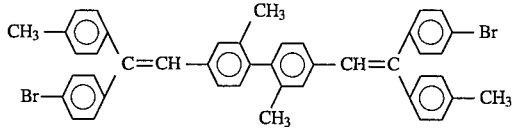
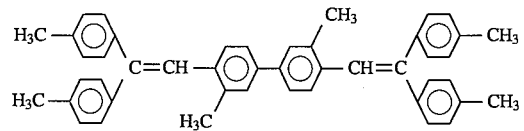
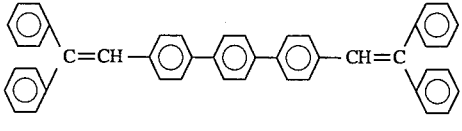
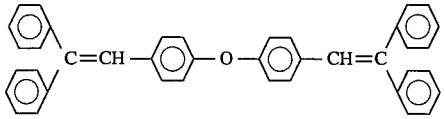
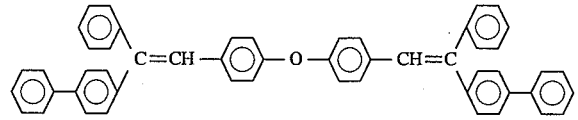
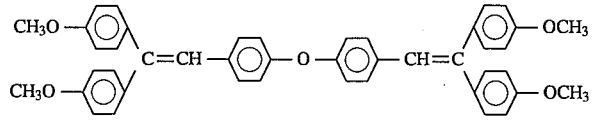

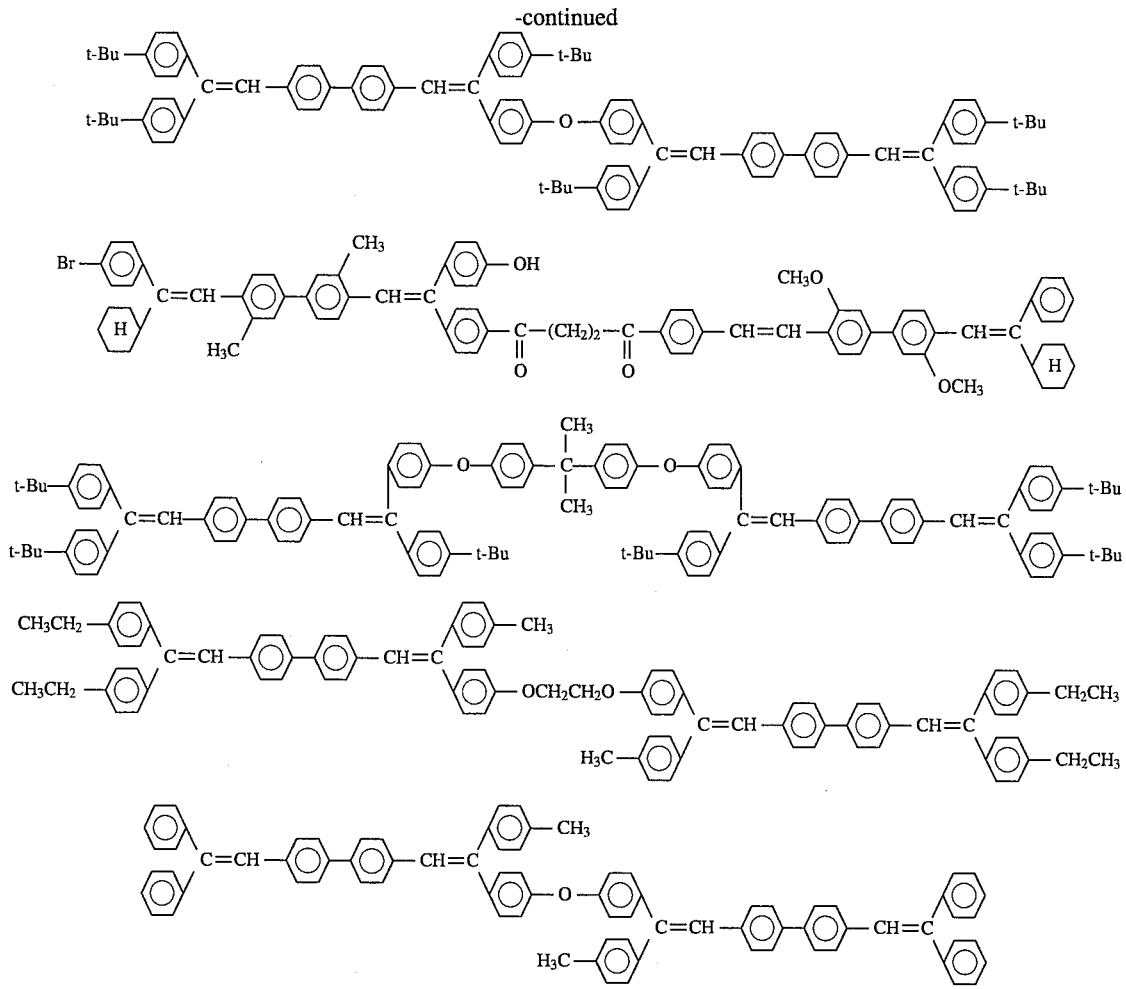

As to the anode in the organic EL device of the present invention, a metal, an alloy, an electroconducting compound or a mixture thereof, all having a large work function (not less than 4 eV), is preferably used as an electrode material. Specific examples of these electrode materials are metals such as Au, and a dielectric transparent materials such as CuI, ITO, $SnO^2$, and ZnO. The anode can be prepared by forming the electrode material into a thin film by vapor deposition or sputtering. To obtain light emission from the electrode, it is preferable that the transmittance of the electrode be more than 10% and the resistance of the sheet as an electrode be not more than several hundred $\Omega/\square$. The film thickness of the anode is usually in the range of 10 nm to 1 μm, preferably 10 to 20 nm, depending upon the material.

On the other hand, as the cathode, a metal, an alloy, an electroconducting compound or a mixture thereof, all having a small work function (not more than 4 eV) is preferably used as an electrode material. Specific examples of such electrode materials are sodium, a sodium-potassium alloy, magnesium, lithium, a magnesium-silver alloy, $Al/AlO_2$, indium, and rare earth metals. The cathode can be prepared by forming the electrode material into a thin film by vapor deposition or sputtering. The resistance of the sheet as an electrode is preferably not more than several hundred $\Omega/\square$. The film thickness is usually in the range of 10 nm to 1 μm, preferably 50 to 200 nm. In the EL device of the present invention, it is preferable that either anode or cathode be transparent or translucent because light emission is transmitted and obtained with a high efficiency by such property.

Next, the hole injecting layer in the present invention is not necessarily required for the present device, but is preferably used for the purpose of improving the emission performance. The preferable material of said hole-injecting layer is one which transports holes to the light emitting layer at a lower electric field, and still more preferably the mobility of holes is made at least $10^{-6}$ cm$^2$/volt.sec in at an applied electric field of $10^4$ to $10^6$ volt/cm. In order to maintain electrons in the light emitting layer, an electron barrier layer may be used between the light emitting layer and the anode.

As the positive hole injecting material, an arbitrary material can be selected and used from the conventionally used ones as the electric charges transporting material for holes and the known ones to be used for the hole-injecting layer of EL devices in conventional photo-conducting materials without specific limitation, provided that the material has the aforesaid favorable properties.

Examples of the materials a for hole-injecting layer include triazole derivatives (described in the specification of U.S. Pat. No. 3,112,197, etc.), oxadiazole derivatives (described in the specification of U.S. Pat. No. 3,189,447, etc.), imidazole derivatives (described in Japanese Patent Publication No. 16096/1962, etc.), polyarylalkane derivatives (described in the specifications of U.S. Pat. Nos. 3,615,402, 3,820,989 and 3,542,544, and in Japanese Patent Publication Nos. 555/1970 and 10983/1976, and further in Japanese Patent Application Laid-Open Nos. 93224/1976, 17105/1980, 4148/1981, 108667/1980, 156953/1980 and 36656/1981, etc.), pyrazoline derivatives or pyrazolone derivatives (described in the specifications of U.S. Pat. Nos. 3,180,729 and 4,278,746, and in Japanese Patent Application Laid-Open Nos. 88064/1980, 88065/1980, 105537/1974, 51086/1980, 80051/1981, 88141/1981, 45545/1982, 112637/1979 and 74546/1970, etc.), phenylenediamine derivatives (described in the specification of U.S. Pat. No. 3,615,404, and in Japanese Patent Publication Nos. 10105/1976, 3712/1971 and 25336/1972, and further in Japanese Patent Application Laid-Open Nos. 53435/1979, 110536/1979 and 119925/1979, etc.), arylamine derivatives (described in the specification of U.S. Pat. Nos. 3,567,450, 3,180,703, 3,240,597, 3,658,520, 4,232,103, 4,175,961 and 4,012,376, and in Japanese Patent Publication Nos. 35702/1974 and 27577/1964, and further in Japanese Patent Application Laid-Open Nos. 144250/1980, 119132/1981 and 22437/1981, and German Patent No. 1,110,518, etc.), amino-substituted chalcone derivatives (described in the specification of U.S. Pat. No. 3,526,501, etc.), oxazole derivatives (described in the specification of U.S. Pat. No. 3,257,203, etc.), styrylanthracene derivatives (described in Japanese Patent Application Laid-Open No. 46234/1981, etc.), fluorenone derivatives (described in Japanese Patent Application Laid-Open No. 110837/1979, etc.), hydrazone derivatives (described in the specification of U.S. Pat. No. 3,717,462, and in Japanese Patent Application Laid-Open Nos. 59143/1979, 52063/1980, 52064/1980, 46760/1980, 85495/1980, 11350/1982 and 148749/1982, etc.), and stilbene derivatives (described in Japanese Patent Application Laid-Open Nos. 210363/1986, 228451/1986, 14642/1986, 72255/1986, 47646/1987, 36674/1987, 10652/1987, 30255/1987, 93445/1985, 94462/1985, 174749/1985, and 175052/1985, etc.)

Further, other examples thereof include silazane derivatives (described in the specification of U.S. Pat. No. 4,950,950), polysilane based material (described in Japanese Patent Application Laid-Open No. 204996/1990), aniline-based copolymer (described in Japanese Patent Application Laid-Open No. 282263/1990), and electrically conductive high molecular oligomer disclosed in the specification of Japanese Patent Application Laid-Open No. 211399/1989, among them, thiophene oligomer.

In the present invention, the above compounds can be used as a hole-injecting material, but it is preferred to use porphyrin compounds (described in Japanese Patent Application Laid-Open No. 2956965/1988, etc.), aromatic tertiary amine compounds or styrylamine compounds (described in the specification of U.S. Pat. No. 4,127,412, and Japanese Patent Application Laid-Open Nos. 27033/1978, 58445/1979, 149634/1979, 64299/1979, 79450/1980, 144250/1980, 119132/1981, 295558/1986, 98353/1986 and 295695/1988), and most preferably, said aromatic tertiary amine compounds are used.

Typical examples of the aforesaid porphyrin compounds are porphin; 1,10,15,20-tetraphenyl-21H,23H-porphin copper (II); 1,10,15,20-tetraphenyl-21H,23H-porphin zinc (II); 5,10,15,20-tetrakis(pentafluorophenyl)-21H, 23H-porphin; siliconphthalocyanine oxide, aluminum phthalocyanine chloride; phthalocyanine (nonmetal); dilithium phthalocyanine; copper tetramethylphthalocyanine; copper phthalocyanine; chrome phthalocyanine; zinc phthalocyanine; lead phthalooyanine; titanium phthalocyanine oxide; magnesium phthalocyanine; and copper octamethylphthalooyanine.

Typical examples of the aforesaid aromatic tertiary amine compounds or styrylamine compounds are N,N,N',N'-tetraphenyl-4,4'-diaminophenyl; N,N'-diphenyl-N,N'-di(3-methylphenyl)-4,4'-diaminobiphenyl; 2,2-bis(4-di-p-tolylaminophenyl)propane; 1,1-bis( 4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl)phenylmethane; N,N'-diphenyl-N,N'-di( 4-methoxyphenyl)-4,4'-diaminobiphenyl; N,N,N',N'-tetraphenyl-4,4'-diaminodiphenyl ether; 4,4'-bis(diphenylamino)quadriphenyl; N,N, N-tri(p-tolyl)amine; 4-(di-p-tolylamino)- 4'-[4(di-p-tolylamino)styryl]stilbene; 4-N,N-diphenylamino-( 2-diphenylvinyl)benzene; 3-methoxy-4'-N,N-diphenylaminostilbene; N-phenylcarbazole; and aromatic dimethylidine-based compounds.

The hole injecting layer in the EL device of the present invention can be obtained by forming the above compound into a film by the known method of film forming such as the vacuum deposition method, the spin coating method, or the LB method. The film thickness as said hole injecting layer is not particularly limited, but usually 5 nm to 5 μm.

The hole injecting layer may consist of one layer comprising one or two or more of these hole-injecting materials, or may be a laminate of the aforesaid hole injecting layer and a hole injecting layer comprising other compound than the before-mentioned hole injecting layer.

As materials for the organic semiconductor layer, mention can be made of the following compounds.

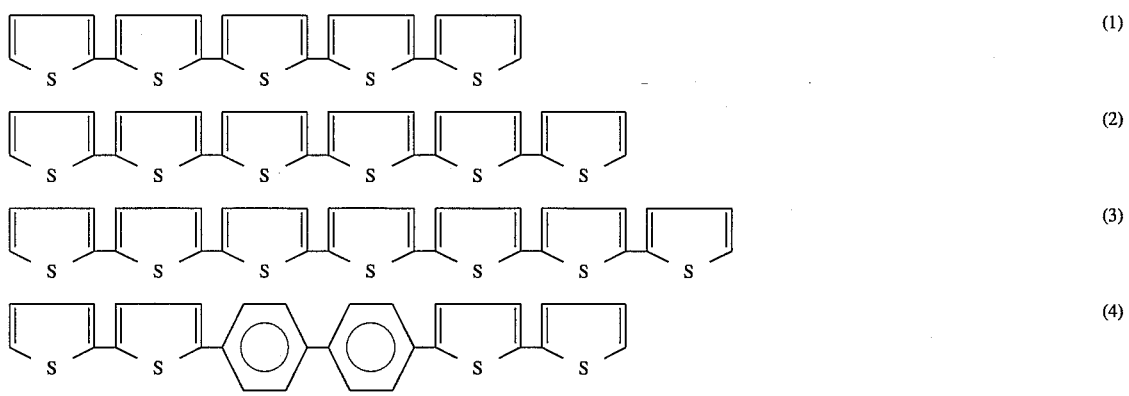

 (5)
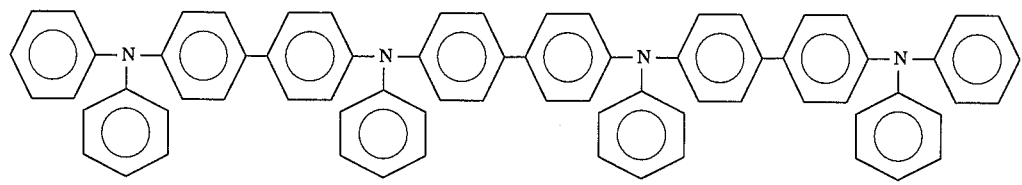 (6)
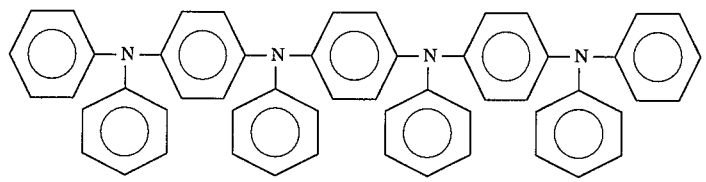 (7)
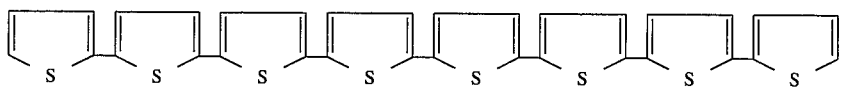 (8)
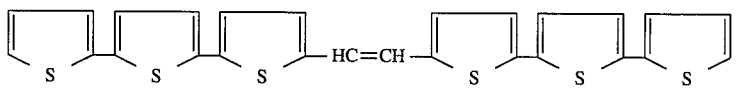 (9)
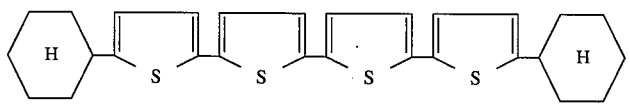 (10)
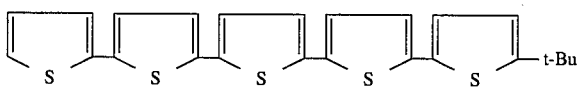 (11)
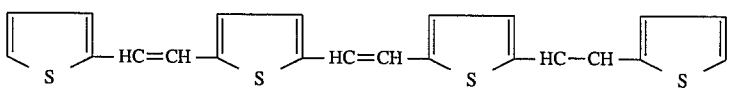 (12)
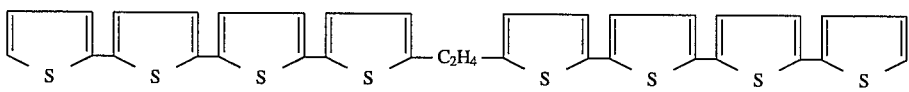 (13)
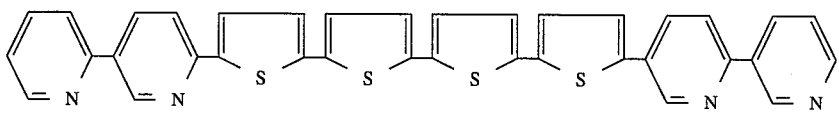 (14)
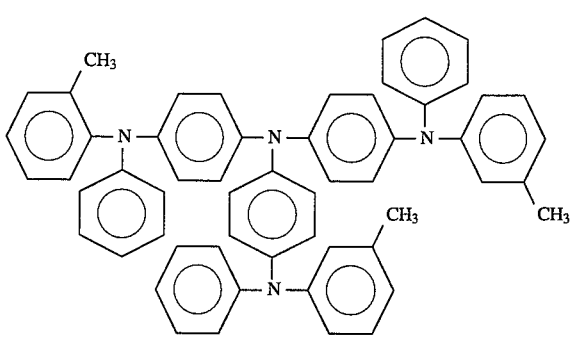 (15)
As materials for the electron barrier layer, mention may be made of the following compounds.

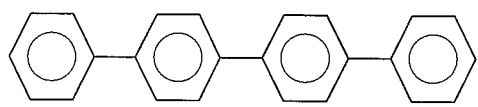  (1)
  (2)
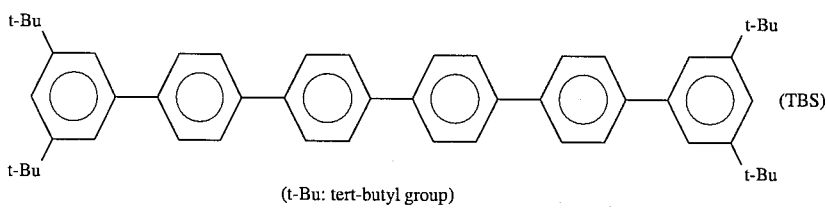  (3)
(TBS)
(t-Bu: tert-butyl group)
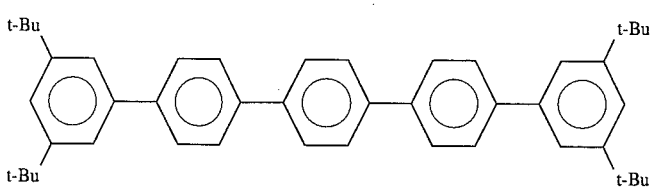  (4)
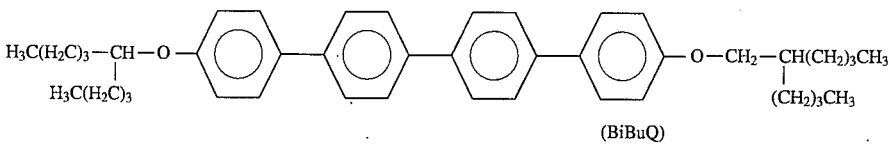  (5)
(BiBuQ)
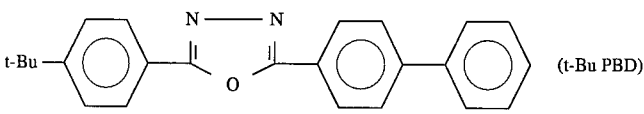  (6)
(t-Bu PBD)
  (7)
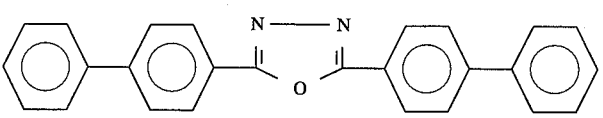  (8)
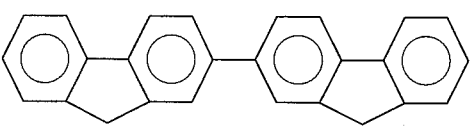  (9)
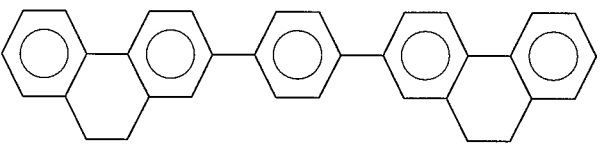  (10)
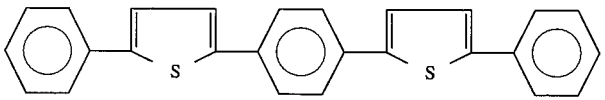  (11)

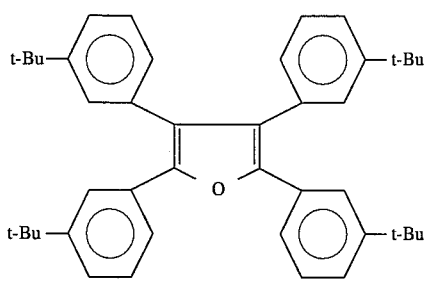
(12)

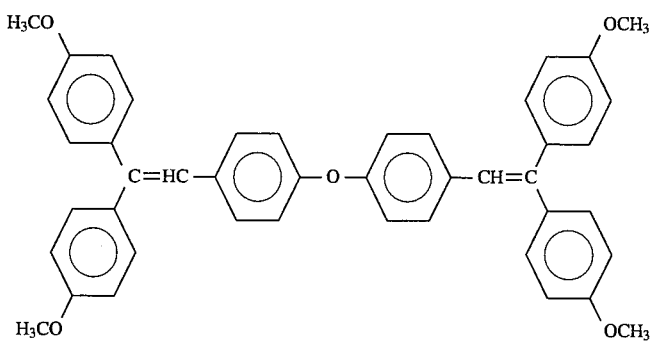
(13)

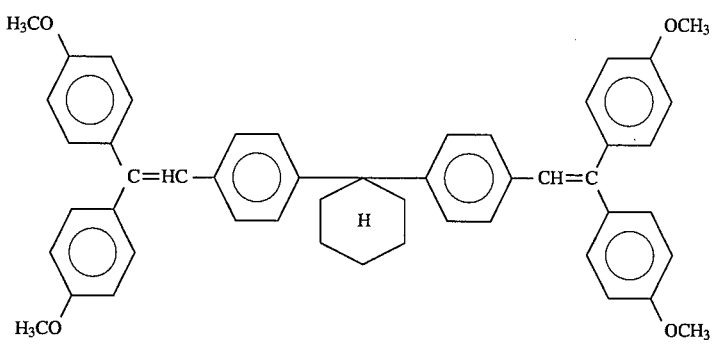
(14)

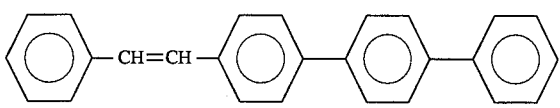
(15)

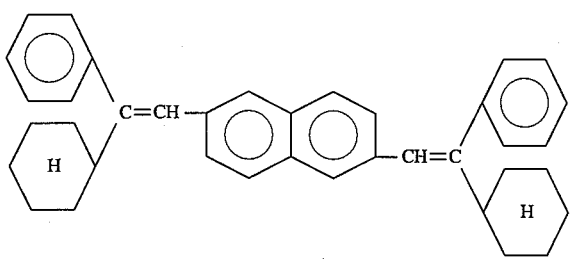
(16)

In addition, there may be used, between the light emitting layer and the cathode, an adhesive layer having excellent transmitting property for electrons and favorable adhesivity to the cathode (i.e., an electron injecting layer, adhesion improving layer).

An adhesive layer to be freshly added preferably contains a material having high adhesivity to both the light emitting layer and the cathode. Such material with high adhesivity thereto is exemplified by a metal complex of 8-hydroxyquinoline or derivative thereof, specifically a metal chelated oxinoide compound containing a chelate of oxine (generally, 8-quinolinol or 8-hydroxyquinoline).

Moreover, there may be employed a layer comprising an oxadiazole derivative in place of the adhesive layer.

As the oxadiazol derivative, mention is made of an electron transmitting compound represented by any of the general formulae (XII) and (XIII)

(XII)

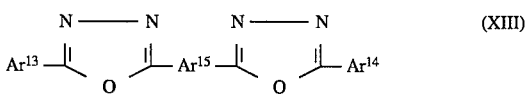
(XIII)

wherein $Ar^{11}$ to $Ar^{14}$ are each a substituted or unsubstituted aryl group, $Ar^{11}$ and $Ar^{12}$, and $Ar^{13}$ and $Ar^{14}$ may be each identical to or different from one another, and $A^{15}$ is a substituted or unsubstituted arylene group. Examples of the aryl group include a phenyl group, biphenyl group, anthracenyl group, perylenyl group and pyrenyl group. Examples of arylene group include a phenylene group, naphthylene group, biphenylene group, anthracenylene group, perylenylene group and pyrenylene group. Examples of the substituent include an alkyl group having 1 to 10 carbon atoms, an alkoxyl group having 1 to 10 carbon atoms and a cyano group. The electron transmitting compound is preferably a thin-film forming compound.

Specific examples of the above-mentioned electron transmitting compound include the following compound.

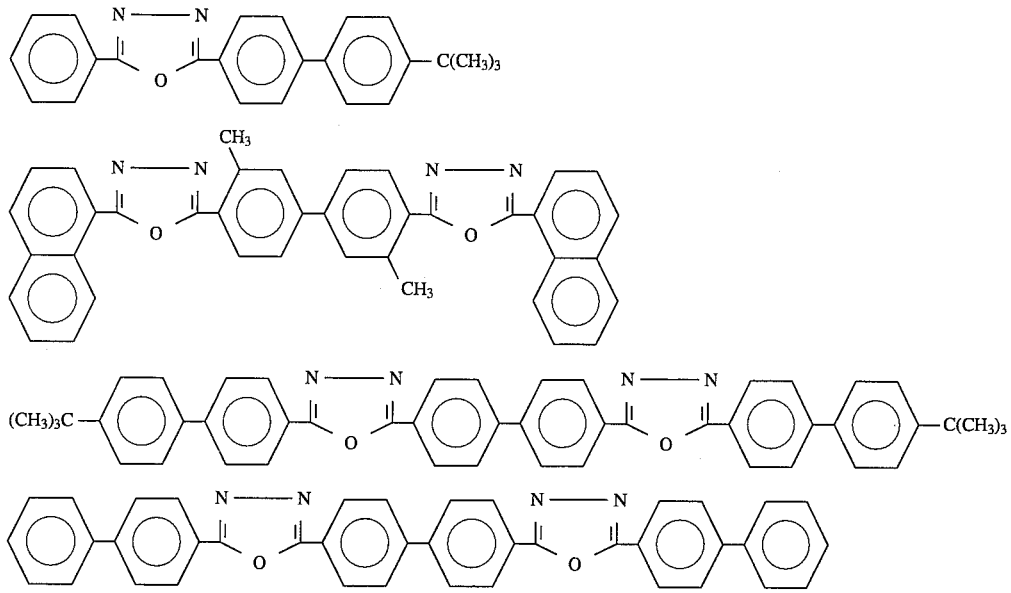

In the following, the present invention will be described in more detail with reference to synthesis examples and working examples, which however shall not be construed to limit the invention thereto.

Synthesis Example 1 (Synthesis of BCzVBi)

The phosphonic acid ester represented by the formula

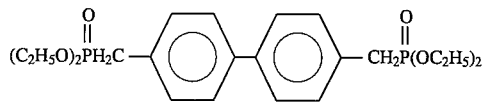

in an amount of 1.8 g was dissolved in 20 ml of DMSO in an atmosphere of argon and 1.0 g of potassium-tert-butoxide (tBuOK) was added to the resultant solution. Thereafter 2.0 g of N-ethylcarbazole-3-carboxyaldehyde was added to the mixture with stirring at room temperature for 5 hours.

To the resultant reaction mixture was added 100 ml of methanol, with the result that yellow powder precipitated. A solution of $I_2$ in benzene was added to the powder to recrystallize the same with the result that 0.8 g of yellow powder was obtained. The resultant product had a melting point of not lower than 300° C.

The determination results by proton nuclear magnetic resonance ($^1$H-NMR), infrared absorption (IR) spectrum and elemental analysis are given below.

(1) $^1$H-NMR [solvent; CDCl$^3$, standard; tetramethylsilane (TMS)]

δ (ppm)=6.9 to 8.5 (m, 26H: central biphenylene ring/carbazole ring-H)

(PBD)

δ (ppm)=4.3 (q, 4H: ethyl-methylene (—CH$_2$—))
δ (ppm)=1.4 (t, 6H: ethyl-methyl (—CH$^3$))

(2) IR spectrum (KBr pellet method)

$v_{c=c}$; 1600 cm$^{-1}$ (C=C stretching vibration)
$δ_{c-H}$; 975 cm$^{-1}$ (C—H out-of-plane deformation vibration)

(3) Elemental analysis (The values in parentheses are theoretical values)

C: 88.82% (89.15%)
H: 5.98% (6.12%)
N: 4.45% (4.73%)
Molecular formula: $C_{44}H_{36}N_2$ It was confirmed from the above-mentioned determination result that the resultant compound was that represented by the formula

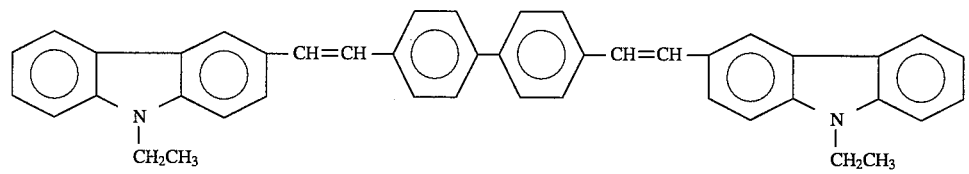

Synthesis Examples 2 to 8

Each compound was synthesized in the same manner as in Synthesis Example 1 except that any of the aldehydes, solvent, base and any of the phosphonio acid esters as shown in Table 1 were used.

TABLE 1

| Synthesis Example | Species of chemical compound | Aldehyde | Solvent | Base | Phosphonic acid ester |
|---|---|---|---|---|---|
| 2 | DPAVBi | Ph-N(Ph)-C₆H₄-CHO | DMSO | tBuOK | (C₂H₅O)₂P(O)CH₂-C₆H₄-C₆H₄-CH₂P(O)(OC₂H₅)₂ |
| 3 | BCzVB | carbazole(N-C₂H₅)-CHO | DMSO | tBuOK | (C₂H₅O)₂P(O)CH₂-C₆H₄-CH₂P(O)(OC₂H₅)₂ |
| 4 | DPAVBm | Ph-N(Ph)-C₆H₄-CHO | DMSO | tBuOK | (C₂H₅O)₂P(O)CH₂-C₆H₄-H₂P(O)(OC₂H₅)₂ (meta) |
| 5 | BCzVBo | carbazole(N-C₂H₅)-CHO | DMSO | tBuOK | (C₂H₅O)₂P(O)CH₂-C₆H₄-CH₂P(O)(OC₂H₅)₂ (ortho) |
| 6 | DPAVBo | Ph-N(Ph)-C₆H₄-CHO | DMSO | tBuOK | (C₂H₅O)₂P(O)CH₂-C₆H₄-CH₂P(O)(OC₂H₅)₂ (ortho) |
| 7 | DPAVB | Ph-N(Ph)-C₆H₄-CHO | DMSO | tBuOK | (C₂H₅O)₂P(O)CH₂-C₆H₄-CH₂P(O)(OC₂H₅)₂ |
| 8 | TCzVB | carbazole(N-C₂H₅)-CHO | DMSO | tBuOK | (C₂H₅O)₂P(O)CH₂-C₆H₄(-CH₂P(O)(OC₂H₅)₂)₂ (trisubstituted) |

Synthesis Example 9

Synthesis of 1-(2-(4-methylphenyl)ethenyl)pyrene (MeSTPy)

8.05 g (20 mmol) of 4-methylbenzyltriphenylphosphonium chloride and 4.61 g (20 mmol) of 1-pyrenecarboxyaldehyde were suspended in 150 ml of ethanol anhydride in an atmosphere of argon. Thereafter 40 ml (20 mmol) of 0.5 mole/liter solution of lithium ethoxide in ethanol was added dropwise to the resultant suspension at room temperature over a period of 30 minutes.

After the completion of the dropwise addition, stirring was carried out at room temperature for 30 minutes, and 20 ml of water was added to the suspension to arrest the reaction. The reaction product thus obtained was filtered and the residual cake was washed with methanol. The washed cake was recrystallized from cyclohexane containing a slight amount of iodine. As a result, yellow acicular crystal was obtained in an amount of 3.41 g (56% yield).

The resultant product had a melting point of 155° to 156° C.

The determination results by proton nuclear magnetic resonance ($^1$H-NMR), IR spectrum and elemental analysis are given below.

(1) $^1$H-NMR [solvent; CDCl$_3$, standard; tetramethylsilane (TMS)]

δ (ppm)=2.40 (s, 3H: benzyl-methyl H)

δ (ppm)=7.2 to 8.6 (m, 15H; aromatic/ethenyl H)

(2) Elemental analysis (The values in parentheses are theoretical values)

C: 94.73% (94.70%)

H: 5.28% (5.30%)

Molecular formula: C$_{24}$H$_{16}$

It was confirmed from the above-mentioned determination result that the resultant compound was MeSTPy.

Synthesis Example 10

Synthesis of 1-(2-(4-(4-phenylethenyl)phenyl)ethenyl)pyrene (STSTPy)

4.9 g (10 mmol) of 4-(2-phenylethenyl)benzyltriphenylphosphonium chloride and 2.30 g (10 mmol) of 1-pyrenecarboxyaldehyde were suspended in 100 ml of ethanol anhydride in an atmosphere of argon. Thereafter 40 ml (20 mmol) of 0.5 mole/liter solution of lithium ethoxide in ethanol was added dropwise to the resultant suspension at room temperature over a period of 30 minutes.

After the completion of the dropwise addition, stirring was carried out at room temperature for 30 minutes, and 10 ml of water was added to the suspension to arrest the reaction. The reaction product thus obtained was filtered and the residual cake was washed with methanol. The washed cake was recrystallized from toluene containing a slight amount of iodine. As a result, yellow acicular crystal was obtained in an amount of 2.11 g (52% yield).

The resultant product had a melting point of 259° to 260° C.

The determination results by proton nuclear magnetic resonance ($^1$H-NMR), IR spectrum and elemental analysis are given below.

(1) $^1$H-NMR [solvent; deuterated dimethyl sulfoxide (DMSO-d6). standard; tetramethylsilane (TMS), 100° C.]

δ (ppm)=7.2 to 8.4 (m, 22H; aromatic/ethenyl H)

(2) Elemental analysis (The values in parentheses are theoretical values)

C: 94.54% to (94.55%)

H: 5.41% to (5.45%)

Molecular formula: C$_3$H$_{22}$

It was confirmed from the above-mentioned determination result that the resultant compound was STSTPy.

Synthesis Example 11

Synthesis of 9-(2-phenylethenyl)anthracene (STA)

3.89 g (10 mmol) of benzyltriphenylphosphonium chloride and 2.06 g (10 mmol) of 9-anthracenecarboxyaldehyde were suspended in 100 ml of ethanol anhydride in an atmosphere of argon. Thereafter 20 ml (10 mmol) of 0.5 mole/liter solution of lithium ethoxide in ethanol was added dropwise to the resultant suspension at room temperature over a period of 30 minutes.

After the completion of the dropwise addition, stirring was carried out at room temperature for 30 minutes, and 10 ml of water was added to the suspension to arrest the reaction. The reaction product thus obtained was filtered and the residual cake was washed with methanol. The washed cake was recrystallized from cyclohexane containing a slight amount of iodine. As a result, yellow acicular crystal was obtained in an amount of 3.41 g (48% yield).

The resultant product had a melting point of 132° to 133° C.

The determination results by proton nuclear magnetic resonance ($^1$H-NMR), IR spectrum and elemental analysis are given below.

(1) $^1$H-NMR [solvent; CDCl$_3$, standard; tetramethylsilane (TMS)]

δ (ppm)=6.8 to 8.2 (m, 16H; aromatic/ethenyl H)

(2) Elemental analysis (The values in parentheses are theoretical values)

C: 94.28% (94.25%)

H: 5.70% (5.75%)

Molecular formula: C$_{22}$H$_{16}$

It was confirmed from the above-mentioned determination result that the resultant compound was STA.

Synthesis Example 12 (Synthesis of DPAVTP)

The phosphonic acid ester represented by the formula

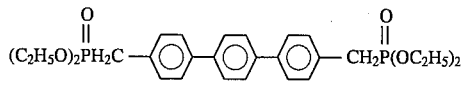

in an amount of 1.86 g and 2.5 g of 4-(N,N-diphenylamino)benzaldehyde were dissolved in 30 ml of DMSO in an atmosphere of argon and 0.9 g of potassium-tert-butoxide (t-BuOK) was added to the resultant solution to proceed with reaction at room temperature for 4 hours. The resultant product was allowed to stand overnight.

To the resultant reaction mixture was added 50 ml of methanol with the result that yellow powder precipitated. After the purification of the precipitate with silica gel column, the precipitate was recrystallized from toluene with the result that 1.5 g of yellow powder was obtained. The resultant product had a melting point of 272.5° to 274.5° C.

The determination results by proton nuclear magnetic resonance ($^1$H-NMR), mass spectrometry and elemental analysis are given below.

(1) $^1$H-NMR [solvent; CDCl$_3$, standard; tetramethylsilane (TMB)]

δ (ppm)=6.9 to 7.6 (m, 44H; central terphenylene ring/vinyl CH=CH/and triphenylamine ring-H)

(2) Mass spectrometry (FD-MS)

Only m/z=768 (z=1) and m/z=384 (z=2) were obtained against

C$_{58}$H$_{44}$N$_2$=768

(3) Elemental analysis (The values in parentheses are theoretical values)

C: 90.72% (90.59%)

H: 5.57% (5.77%)

N: 3.71% (3.64%)

It was confirmed from the above-mentioned determination result that the resultant compound was that represented by the formula

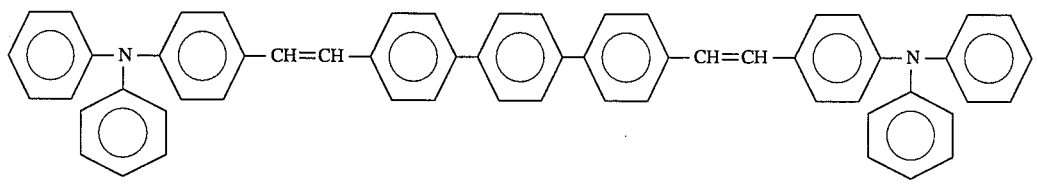

EXAMPLES 1 TO 8

Indium tin oxide (ITO) was provided on a 25 mm×75 mm×1.1 mm glass substrate (NA40, produced by HOYA Corporation) in a 100 nm thick film by vapor deposition method to obtain a transparent supporting substrate (produced by HOYA Corporation).

The substrate had been ultrasonically washed in isopropyl alcohol for 5 minutes, dried by blowing nitrogen and, then subjected to UV ozone washing for 10 minutes in an apparatus (UV 300; manufactured by Samco International Institute Inc.). A substrate holder of a commercially available vapor deposition system (manufactured by ULVAC Co., Ltd.) was fixed onto the transparent supporting substrate. Then 200 mg of N,N'-bis(3-methylphenyl)-N,N'-diphenyl[1,1'-biphenyl]-4,4'-diamine(TPD) was placed in an electrically-heated boat made of molybdenum, 200 mg of 4,4'-bis(2,2-diphenylvinyl)biphenyl (DPVBi) was placed in another electrically heated boat made of molybdenum, further 200 mg of the compound (A) (shown in Table 2) as the charge injection auxiliary material was placed in another electrically heated boat made of molybdenum, and the vacuum chamber was depressurized to $1\times10^{-4}$ Pa. After that, the boat containing TPD was heated to 215° to 220° C., and TPD was vapor-deposited on the transparent supporting substrate at a vapor deposition rate of 0.1 to 0.3 nm/sec to obtain a positive hole injection layer of 60 nm in film thickness. In this vapor deposition process, the substrate was at room temperature.

Without taking the substrate out of the vacuum chamber, DPVBi was laminated in a thickness of 40 nm on the positive hole injection layer and simultaneously, the boat containing the compound (A) was heated to mix the compound (A) in the light emitting layer. As to the vapor deposition rate, the deposition rate of the compound (A) was set to the values in column (C) in Table 2 against the deposition rate of DPVBi in column (B) in Table 2. Therefore, the mixing Patio (ratio of the compound (A) to the host material) was set to the values in column (D) in Table 2.

Subsequently, the pressure in the vacuum chamber was raised to the atmospheric pressure, an aluminum complex of 8-hydroxyquinoline as the material of the adhesive layer was newly placed in an electrically-heated boat made of molybdenum, 1 g of magnesium ribbon was placed in an electrically heated boat made of molybdenum, and 500 mg of silver wire was placed in a tungsten basket. The pressure of vacuum chamber was reduced to $1\times10^{-4}$ Pa. Then, the aluminum complex of 8-hydroxyquinoline was vapor-deposited at a vapor deposition rate of 0.01 to 0.03 nm/sec to form an adhesive layer with a film thickness of 20 nm. In addition, silver and magnesium were simultaneously vapor-deposited at vapor deposition rate of 0.1 nm/sec and 1.4 nm/sec, respectively to form the cathode composed of the mixed electrode of silver and magnesium with a film thickness of 150 nm.

A voltage of 7 V was applied to the device thus obtained, and measurements were made of the current density and the brightness of the device to calculate the luminous efficiency of the same. The results are given in Table 2.

TABLE 2

| | (A) | (B) (nm/sec) | (C) (nm/sec) | (D) Mixing ratio (% by weight) |
|---|---|---|---|---|
| Example 1 | DPAVBi | 2.8–3.0 | 0.1–0.13 | 3–4 |
| Example 2 | BCzVB | 3.5–4.5 | 0.02 | 0.6–0.4 |
| Example 3 | BCzVBi | 3.0–4.0 | 0.7 | 15–18 |
| Example 4 | DPAVBm | 2.7–3.7 | 0.1–0.13 | 3–5 |
| Example 5 | BCzVBo | 2.7–3.7 | 0.1–0.13 | 3–5 |
| Example 6 | DPAVBo | 3.0–4.5 | 0.04 | 0.9–1.3 |
| Example 7 | DPAVB | 3.0–4.0 | 0.05 | 1.2–1.6 |
| Example 8 | TCzVB | 2.5–3.0 | 0.05–0.07 | 1.6–2.7 |
| Comparative Example 1 | none | 2 | none | 0 |

| | Current density (mA/cm$^2$) | Brightness (cd/m$^2$) | Luminous efficiency (lm/w) | Luminous color |
|---|---|---|---|---|
| Example 1 | 15.0 | 230 | 0.7 | bluish green |
| Example 2 | 7.5 | 200 | 1.2 | blue |
| Example 3 | 9.5 | 162 | 0.8 | blue |
| Example 4 | 9.0 | 164 | 0.8 | blue |
| Example 5 | 11.0 | 130 | 0.5 | blue |
| Example 6 | 11.4 | 220 | 0.9 | blue |
| Example 7 | 7.5 | 210 | 1.3 | greenish blue |
| Example 8 | 7.0 | 160 | 1.0 | blue |
| Comparative Example 1 | 0.7 | 10 | 0.6 | blue |

Remarks: The abbreviated compounds (A) are detailed as follows

DPAVBi:
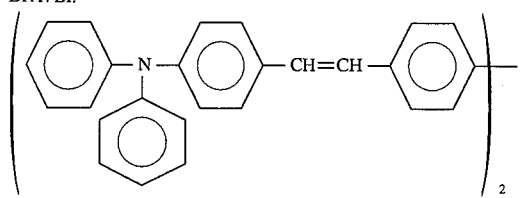
BCzVB:
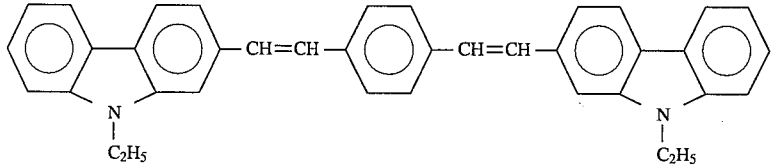
BCzVBi:
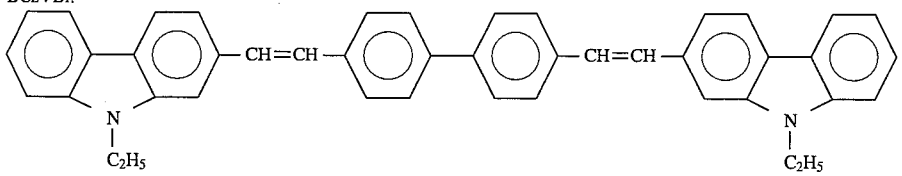
DPAVBm:
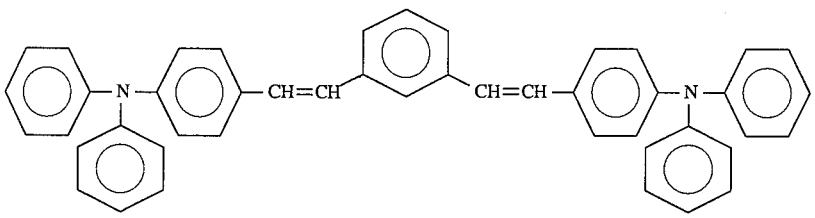
DCzVBo:
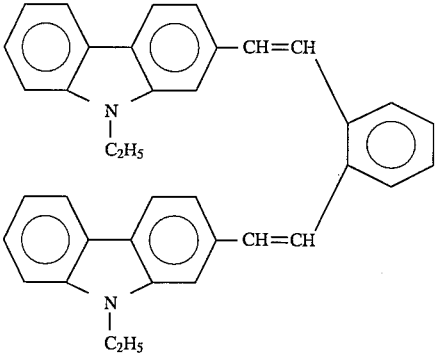
DPAVBo:
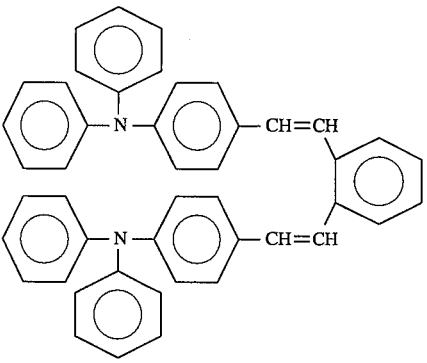
DPAVB:

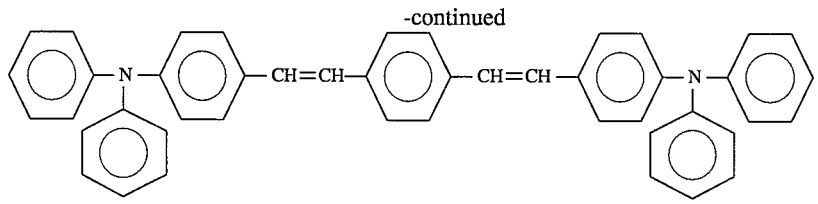

TCzVB:

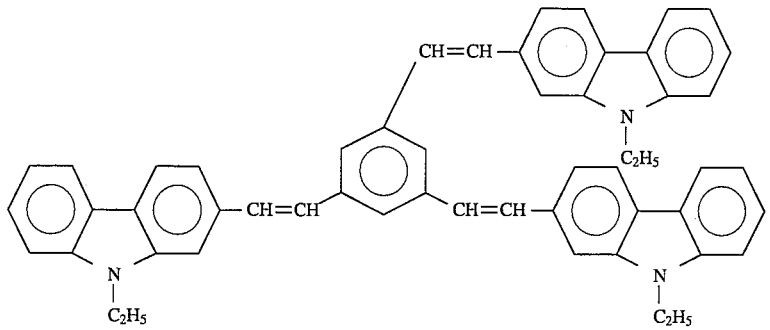

As can be seen from Table 2, the examples having the compound (A) mixed therein are increased in the amount of current flow in terms of current density and is improved in charge injection properties, which leads without fail to a decrease in voltage required to be applied to the device.

Comparative Example 1

The procedure in Example 1 was repeated to prepare the device except that the use of the compound (A) was omitted.

The device thus obtained had a single luminous peak wavelength of 472 nm.

EXAMPLE 9

The procedure in Example 1 was repeated to prepare the device except that DPAVBi as the compound (A) was incorporated in DPVBi in an amount of 3% by weight, the film thickness of the light emitting layer (mixed layer of DPAVBi and DPVBi) was set at 55 nm, and the film thickness of the positive hole injecting layer was set at 45 nm.

A voltage of 8 V was applied to the device thus obtained, with the results that there was obtained a light emission having a current density of 7 mA/cm², brightness of 400 cd/m² and peak wavelength of 494 nm. The resultant light emission constituted the spectrum having three peaks at 462 nm, 494 nm and 534 nm, which demonstrates that DPAVBi emits light. The luminous efficiency thereof was 2.2 lumen/W and was surpassingly excellent as compared with that of the comparative example. It is also pointed out that the charge injection auxiliary material exhibits fluorescent doping effect as the case may be.

EXAMPLE 10

The procedure in Example 1 was repeated to prepare the device except that the aluminum complex of 8-hydroxyquinoline was used as the light emitting material, STP was used as the charge injection auxiliary material, the mixing ratio thereof was set at 0.7% by weight and the film thickness of the light emitting layer was set at 40 nm. A voltage of 5.5 V was applied to the device thus obtained, with the result that there was obtained a green light emission having a current density of 23 mA/cm² and brightness of 1000 cd/m². The luminous efficiency thereof was 2.4 lumen/W.

STP:

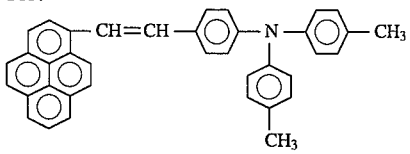

Comparative Example 2

The procedure in Example 1 was repeated to prepare the device except that the aluminum complex of 8-hydroxyquinoline was used as the light emitting material and the use of the compound (A) was omitted.

A voltage of 7 V was applied to the device thus obtained, with the result that there was obtained a green light emission having a current density of 23 mA/cm² and brightness of 780 cd/m². The luminous efficiency thereof was 1.5 lumen/W.

Comparative Example 3

The procedure in Example 1 was repeated to prepare the device except that DPVBi was used as the host material, 3-(2'-benzothiazolyl)- 7-diethylamino-coumarin (KU 7: Japanese Patent Application Laid-Open No. 264692/1988) was used in place of the charge injection auxiliary material, and the mixing ratio thereof was set at 2% by weight.

A voltage of 7 V was applied to the device thus obtained, with the result that there was obtained a green light emission having a current density of 5 mA/cm² and brightness of 150 Cd/m².

It is understood by the result of comparing Comparative Examples 2 and 3 with Example 10 that the device comprising the charge injection auxiliary material according to the present invention attains a decrease in voltage required to be applied to the device as well as an enhancement in luminous efficiency. In addition, the device containing coumarin 7 (KU 7) as the dopant causes the applied charge to increase.

EXAMPLES 11 TO 13

The procedures in Examples 1 to 8 were repeated to prepare the devices except that UV washing was carried out for 30 minutes. A voltage of 7 V was applied to the device thus obtained, and measurements were made of the current density and the brightness of the device to calculate the luminous efficiency of the same. The results obtained are given in Table 3.

TABLE 3

| | (A) | (B) (nm/sec) | (C) (nm/sec) | (D) Mixing ratio (% by weight) |
|---|---|---|---|---|
| Example 11 | STSTPy | 2.5–3.2 | 0.1–0.12 | 3.2 approx. |
| Example 12 | MeSTPy | 2.7–3.7 | 0.1–0.12 | 3.2 approx. |
| Example 13 | STPy | 3.0–3.5 | 0.06 | 2 approx. |

| | Current density (mA/cm$^2$) | Brightness (cd/m$^2$) | Luminous efficiency (lm/W) | Luminous color |
|---|---|---|---|---|
| Example 11 | 7.0 | 101 | 0.65 | bluish green |
| Example 12 | 6.0 | 120 | 0.9 | blue |
| Example 13 | 8.0 | 110 | 0.62 | blue |

Reference Example 1

An initial DC voltage of 6.94 V was applied to the device as obtained in Example 11 to make the device continuously emit light under a constant current condition. The brightness after 200 hours of continuous driving maintained 85% of the initial brightness, thus exhibiting an extremely stable light emission. The increase in the driving voltage was only one (1) V.

On the other hand, the device as obtained in Comparative Example 1 was made to continuously emit light under the condition same as above with the result that the brightness after 200 hours of continuous driving decreased to one half, that is, 50% of the initial brightness.

EXAMPLES 14 TO 16

The procedures in Examples 1 to 8 were repeated to prepare the devices except that for the positive hole injecting layer, CuPc (laminate constitution of copper phthalocya-

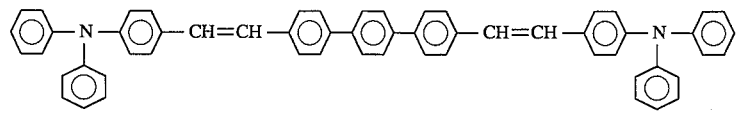

nine/NPD with a film thickness of 20 nm/40 nm) was used in Example 14, and MTDATA/NPD with a film thickness of 60 nm/20 nm which is a kind of semiconductor oligomer was used in Examples 15 and 16. NPD: [N,N-bis(1-naphthyl)-N,N'-diphenyl-(1,1'-biphenyl)-4,4'-diamine]

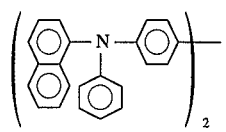

MTDATA:

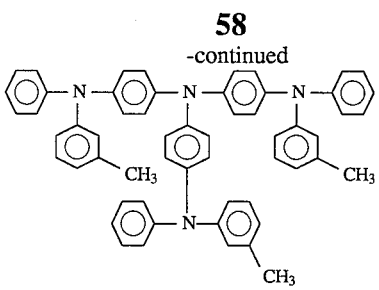

A voltage of 7 V was applied to the device thus obtained, and measurements were made of the current density and the brightness of the device to calculate luminous efficiency of the same. The results are given in Table 4.

The charge injection auxiliary material as used in any of Examples 14 to 16 functioned as the fluorescent dopant and had an energy gap less than that in the light emitting layer. The energy gap in a light emitting layer is determined by the energy value at the light absorption end of the vapor-deposited film, while that in a charge injection auxiliary material is determined by the energy value at the light absorption edge of a dilute solution from a solvent having a low dielectric constant (for example, toluene and a halogenous solvent).

TABLE 4

| | (A) | (B) (nm/sec) | (C) (nm/sec) | (D) Mixing ratio (% by weight) |
|---|---|---|---|---|
| Example 14 | DPAVBi | 2.7–3.0 | 0.12 | 3.8–4.2 |
| Example 15 | DPAVTP | 2.5–3.0 | 0.09 | 2.9–3.4 |
| Example 16 | DPAVB | 3.0–5.0 | 0.09 | 1.8–2.9 |

| | Current density (mA/cm$^2$) | Brightness (cd/m$^2$) | Luminous efficiency (lm/W) | Luminous color |
|---|---|---|---|---|
| Example 14 | 21.6 | 540 | 1.3 | greenish blue |
| Example 15 | 7.1 | 111 | 0.64 | blue |
| Example 16 | 2.58 | 160 | 2.8 | bluish green |

Remark: The abbreviated compound (A) are detailed as follows DPAVBi, DPAVB; as previously defined.

As can be seen from Table 4 and as compared with Comparative Example 1, any of the devices in these examples attains improvement in charge injection properties, decrease in voltage required to be applied and enhancement in efficiency.

EXAMPLES 17 AND 18

To any of the devices as obtained in Examples 14 and 15, an initial voltage as shown in Table 5 was applied in an atmosphere of dry nitrogen to carry out continuous driving under a constant current condition. As a result, half-lives as shown in Table 5 were obtained, thus achieving prolonged service life. The prolonged service life is observed in a charge injection auxiliary material having in particular, an energy gap less than that in the light emitting layer. Table 5 gives the energy gap along with the ionization energy in the charge injection auxiliary material. The initial brightness was 100 cd/m², and the light emitting layer had an energy gap of 2.97 eV.

TABLE 5

| | Initial voltage (V) | Voltage on reduction to half (V) | Half life (hr) | Charge injection auxiliary material | |
|---|---|---|---|---|---|
| | | | | Energy gap (eV) | Ionization energy (eV) |
| Example 17 | 6.2 | 7.8 | 1000 | 2.84 | 5.6 |
| Example 18 | 7.1 | 9.0 | 610 | 2.87 | 5.6 |

As can be seen from Table 5, the devices are low in voltage increase. The conventional devices usually bring about an increase in driving voltage of 3 to 4 V with the lapse of time, whereas the devices in Examples 17 and 18 showed a lessened increase in driving voltage of 1.6 V and 1.9 V, respectively, thereby demonstrating excellent stability.

INDUSTRIAL AVAILABILITY

The charge injection auxiliary material according to the present invention is capable of effectively enhancing charge injection properties and hence is well suited for use in various organic electronic devices such as electrophotographic photoreceptors and organic EL devices.

In addition, the organic EL device comprising the above-mentioned charge injection auxiliary material according to the present invention is characterized by a lowered applied-voltage, an enhanced light emission efficiency and a prolonged service life.

We claim:

1. A functional layer of an organic electron device, said functional layer comprising a positive-hole transporting organic substance which is subjected to a positive-hole injection from an external layer and has enhanced positive-hole injection properties by incorporation of a charge injection auxiliary material in said functional layer, said charge injection auxiliary material comprising a stilbene, distyrylarylene or tris(styrylarylene) compound, said charge injection auxiliary material being in an amount of 0.05 to 9% by weight based on the weight of the positive-hole transporting organic substance.

2. The functional layer according to claim 1, wherein the functional layer is a light emitting layer, a positive-hole injecting layer, a positive-hole transporting layer or an electron barrier layer.

3. The functional layer according to claim 2, wherein the derivative of stilbene, distyrylarylene or tris(styrylarylene) has at least one electron donating group.

4. The functional layer according to claim 3, wherein the electron donating group is selected from the group consisting of an alkyl group having 1 to 10 carbon atoms, an aryloxy group having 6 to 20 carbon atoms and an amino group with a hydrocarbon radical having 1 to 30 carbon atoms.

5. The functional layer according to claim 1, wherein the charge injection auxiliary material comprises a stilbene derivative of the formula (I) or (II)

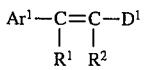  (I)

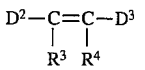  (II)

wherein Ar¹ is an aryl group having 6 to 20 carbon atoms, a thienyl group or a bithienyl group, R¹ to R⁴ are each a hydrogen atom, an aryl group having 6 to 20 carbon atoms, a thienyl group or a bithienyl group, R¹ and R² are each the same or different, R³ and R⁴ are each the same or different, D¹ to D³ are each an aryl group having 6 to 20 carbon atoms which is substituted with an electron donating group, a thienyl group or a bithienyl group or a condensed polycyclic group having 10 to 30 carbon atoms, D² and D³ are the same or different, and Ar¹ and R¹ to R⁴ are each unsubstituted or substituted with an alkyl group having 1 to 10 carbon atoms, an alkoxy group having 1 to 10 carbon atoms, an aryloxy group having 6 to 10 carbon atoms, an arylalkyl group having 7 to 10 carbon atoms or an amino group with a hydrocarbon radical having 1 to 20 carbon atoms.

6. The functional layer according to claim 1 wherein the charge injection auxiliary material comprises a distyrylarylene derivative of the formula (III) or (IV)

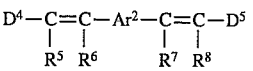  (III)

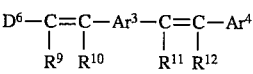  (IV)

wherein A² and Ar³ are each an arylene group having 6 to 20 carbon atoms, a thienylene group or a bithienylene group, Ar⁴ is an aryl group having 6 to 20 carbon atoms, a thienyl group or a bithienyl group, R⁵ to R¹² are each a hydrogen atom, an aryl group having 6 to 20 carbon atoms, a thienyl group or a bithienyl group, R⁵ to R⁸ are the same or different;

R⁹ to R¹² are each the same or different,

D⁴ to D⁶ are each a thienyl group, a bithienyl group, a condensed polycyclic group having 10 to 30 carbon atoms or an aryl group having 6 to 20 carbon atoms which is substituted with an electron donating group, D⁴ and D⁵ are the same or different, and Ar² to Ar⁴ and R⁵ to R¹² are each unsubstituted or substituted with an alkyl group having 1 to 10 carbon atoms, an alkoxy group having 1 to 10 carbon atoms, an aryloxy group having 6 to 10 carbon atoms, an arylalkyl group having 7 to 10 carbon atoms or an amino group with a hydrocarbon radical having 1 to 20 carbon atoms.

7. The functional layer according to claim 1 wherein the charge injection auxiliary material comprises a tris(styrylarylene) derivative of the formula (V), (VI) or (VII)

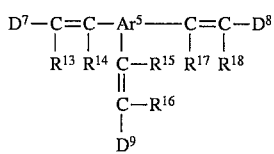

(V)

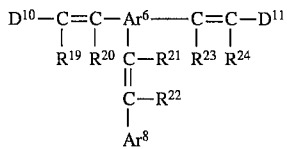

(VI)

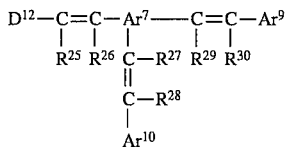

(VII)

wherein $Ar^5$ to $Ar^7$ are each a trivalent aromatic ring radical having 6 to 24 carbon atoms, $Ar^8$ to $Ar^{10}$ are each an aryl group having 6 to 20 carbon atoms, a thienyl group or a bithienyl group, $Ar^9$ and $Ar^{10}$ are each the same or different, $R^{13}$ to $R^{30}$ are each a hydrogen atom, an aryl group having 6 to 20 carbon atoms, a thienyl group or a bithienyl group, $R^{13}$ to $R^{18}$ are each the same or different;

$R^{19}$ to $R^{24}$ are each the same or different;

$R^{25}$ to $R^{30}$ are each the same or different;

$D^7$ to $D^{12}$ are each an aryl group having 6 to 20 carbon atoms which is substituted with an electron donating group, a thienyl group or a bithienyl group or a condensed polycyclic group having 10 to 30 carbon atoms, $D^7$ to $D^9$, $D^{10}$ and $D^{11}$ are each the same or different, and $Ar^5$ to $Ar^{10}$ and $R^{13}$ to $R^{30}$ are each unsubstituted or substituted with an alkyl group having 1 to 10 carbon atoms, an alkoxy group having 1 to 10 carbon atoms, an aryloxy group having 6 to 10 carbon atoms, an arylalkyl group having 7 to 10 carbon atoms or an amino group with a hydrocarbon radical having 1 to 20 carbon atoms.

8. An organic electroluminescence device which comprises an anode, a cathode and disposed therebetween a light emitting layer containing a charge injection auxiliary material, said charge injection auxiliary material having an ionization energy which is smaller than the ionization energy of said light emitting layer, said charge injection auxiliary material comprising a stilbene, distyrylarylene or tris(styrylarylene) derivative, said charge injection auxiliary material being in an amount of 0.05 to 9% by weight based on the weight of the light emitting layer.

9. The organic electroluminescence device according to claim 8, said charge injection auxiliary material has an energy gap which is smaller than the energy gap of the light emitting layer.

10. The organic electroluminescence device according to claim 9, wherein the charge injection auxiliary material is excited by the recombination of positive holes and electrons in the light emitting layer whereby light is emitted.

11. The organic electroluminescence device according to claim 9, wherein the charge injection auxiliary material has an energy gap which is smaller than the energy gap of the light emitting layer by at least 0.1 eV.

12. The functional layer according to claim 3, wherein the electron donating group is selected from the group consisting of phenoxy group, biphenyloxy group, naphthloxy group, anthranyloxy group, terphenylyloxy group, methoxy group, ethoxy group, isopropoxy group, tert-butyloxy group, pentyloxy group, dimethylamino group, diethylamino group, diphenylamino group, phenylmethylamino group, phenylethylamino group, phenylmethylethylamino group, ditolylamino group, ethylphenylamino group, phenylnaphthylamino group and phenylbiphenylylamino group.

13. The functional layer according to claim 1, wherein the charge injection auxiliary material comprises a compound selected from the group consisting of

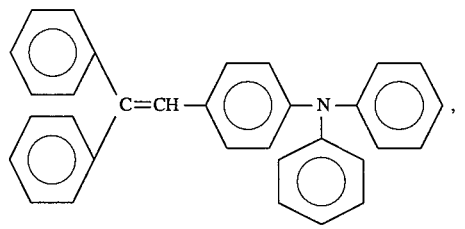

,

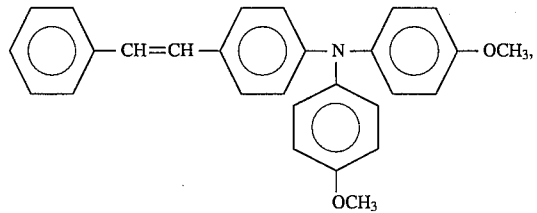

,

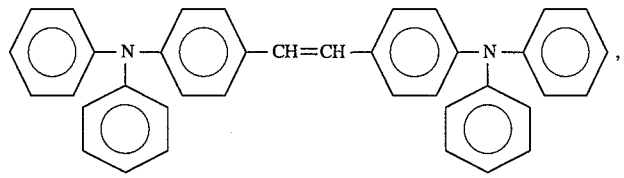

,

-continued
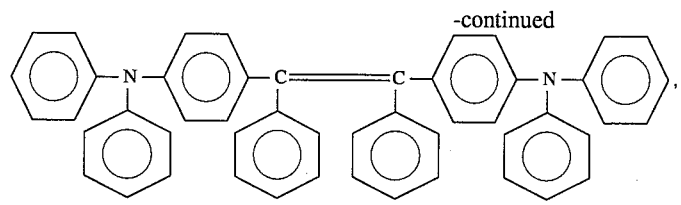
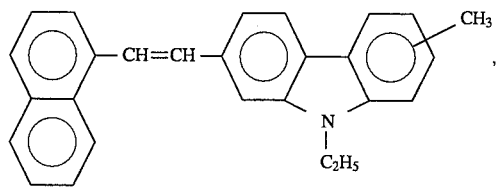
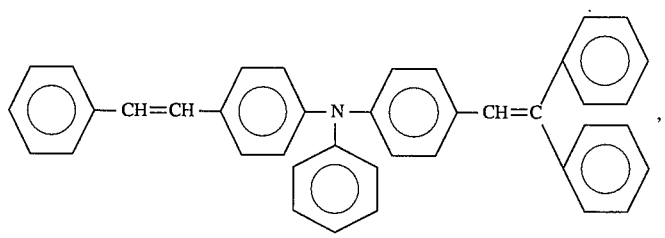
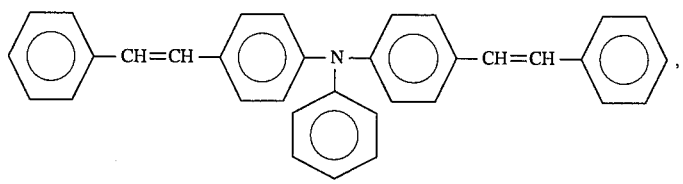
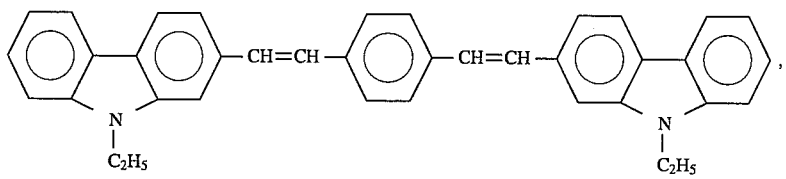
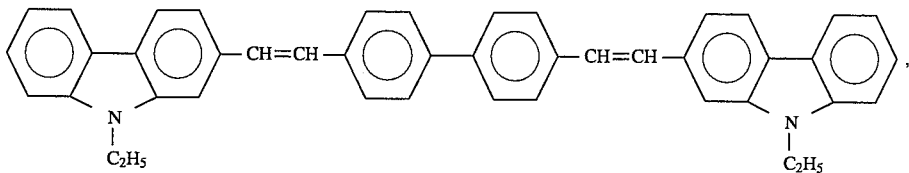
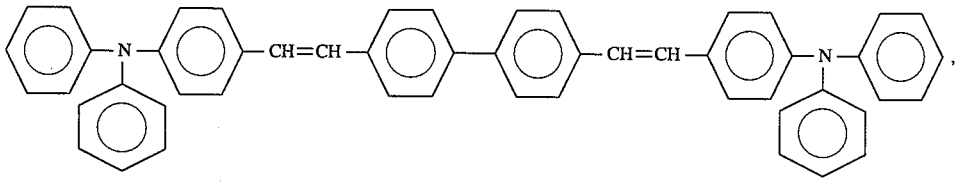
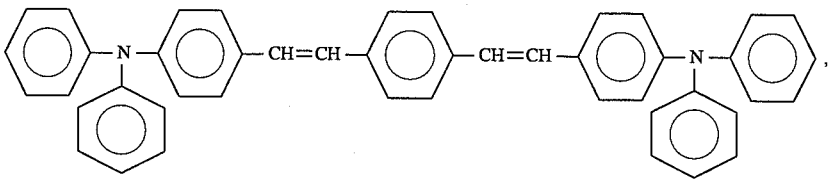

-continued
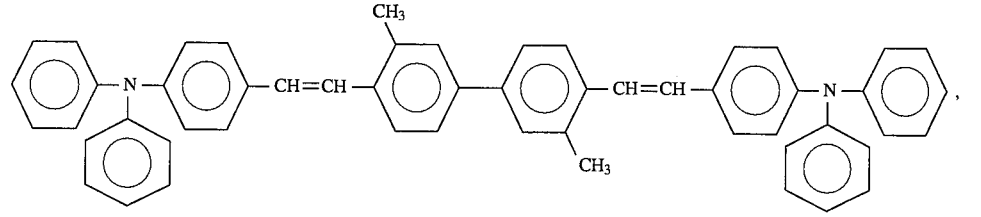
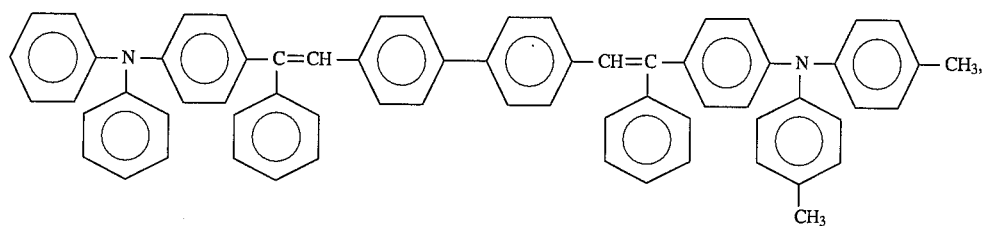
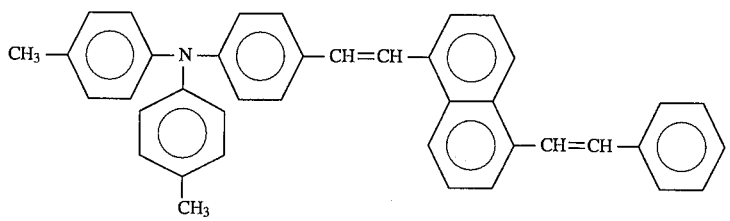
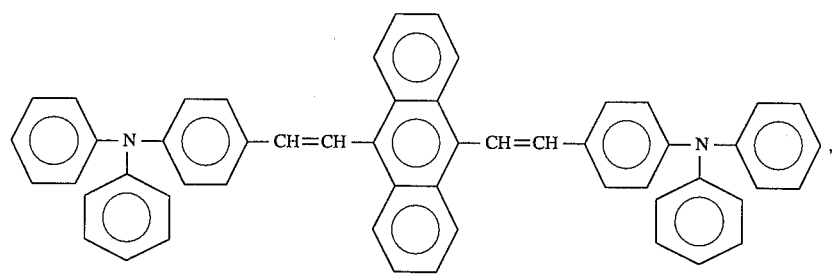
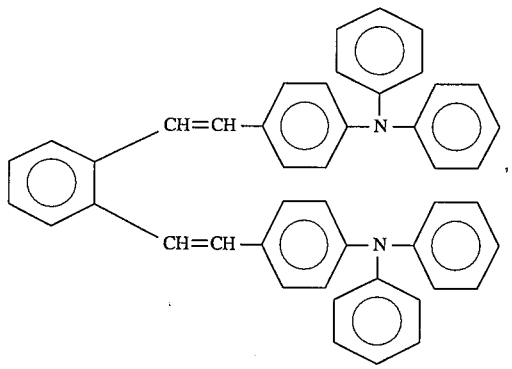
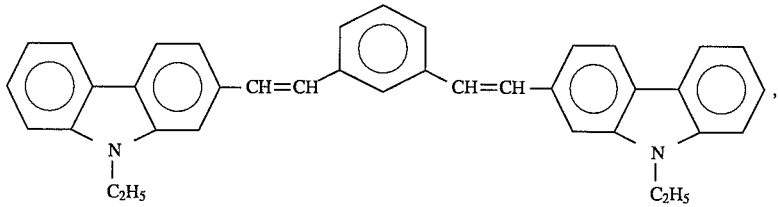

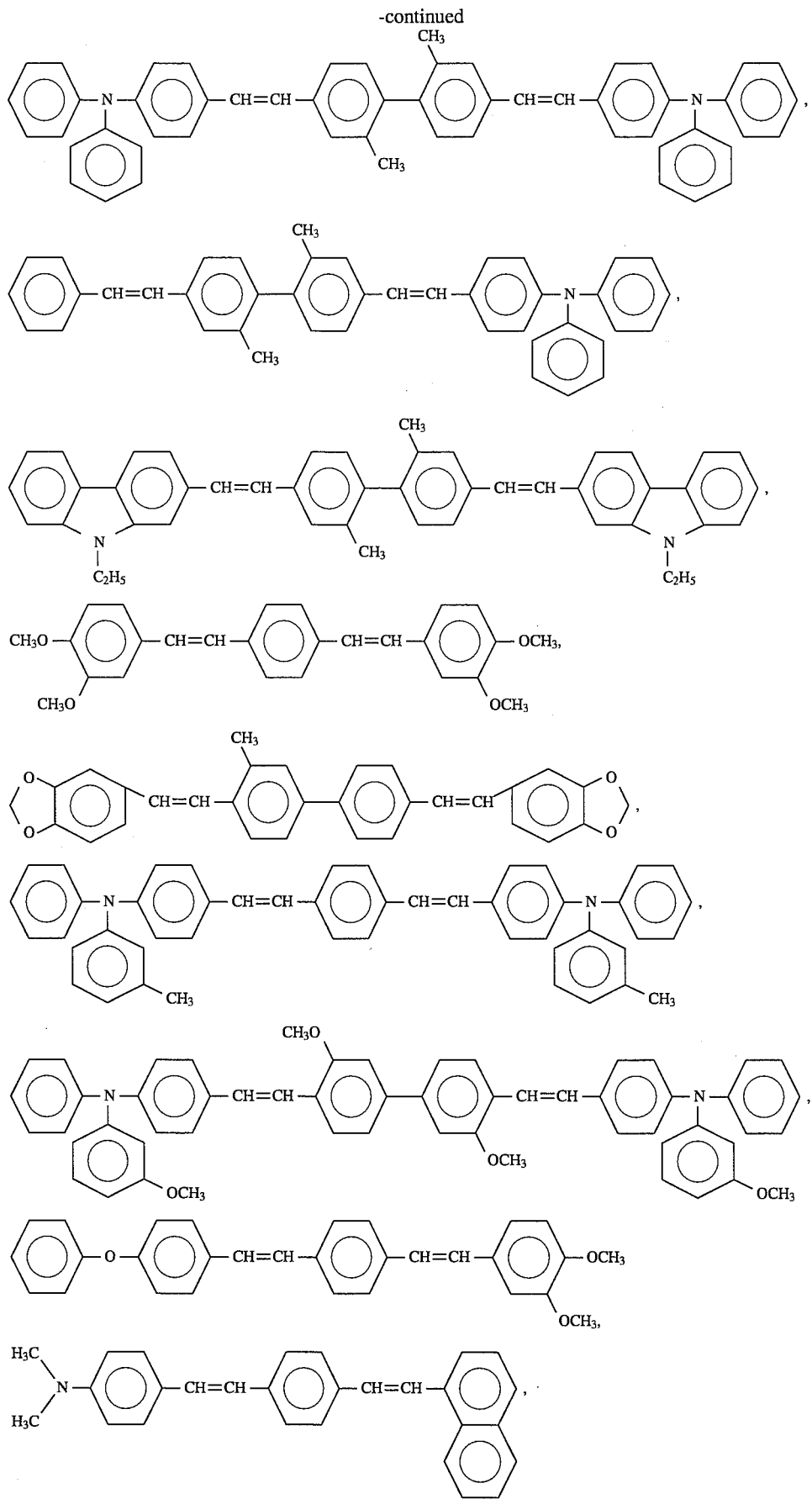

-continued
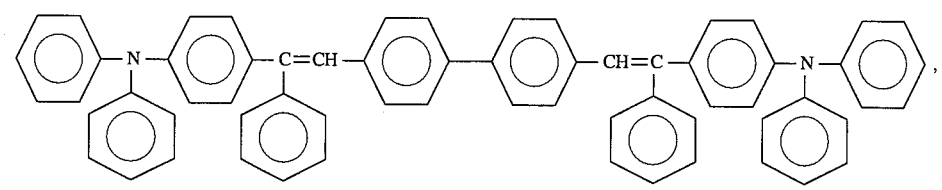
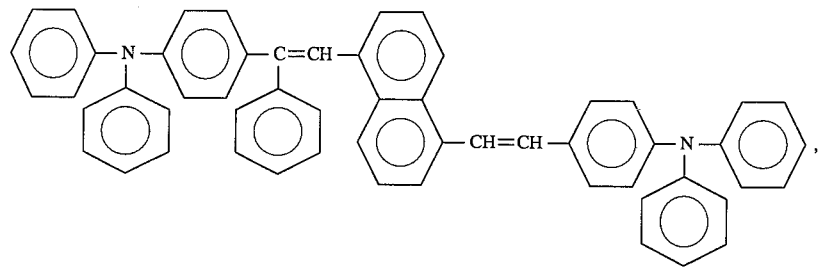
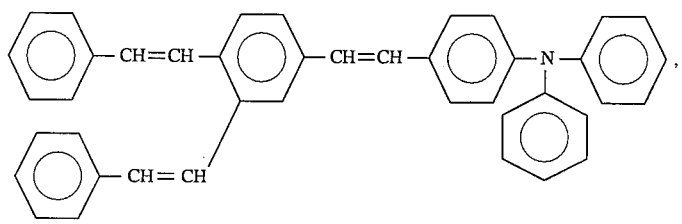
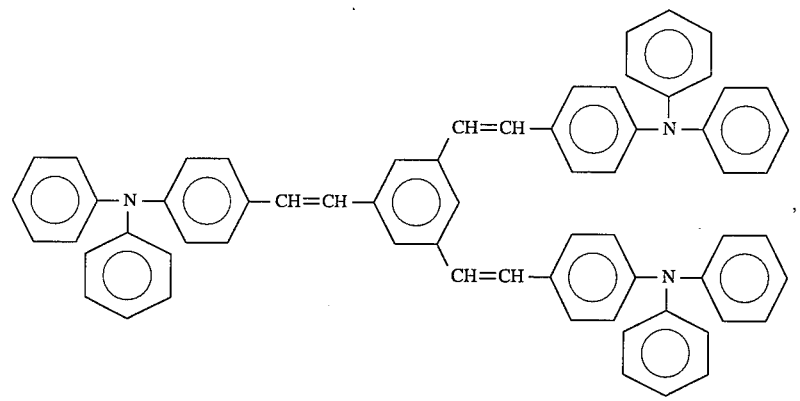
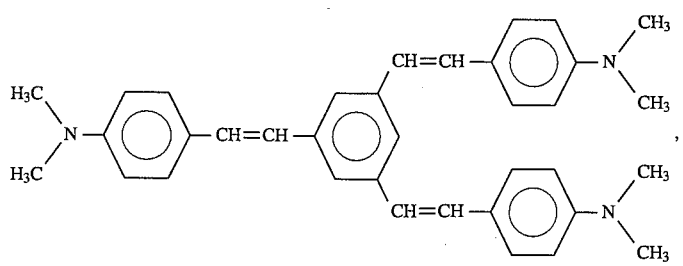
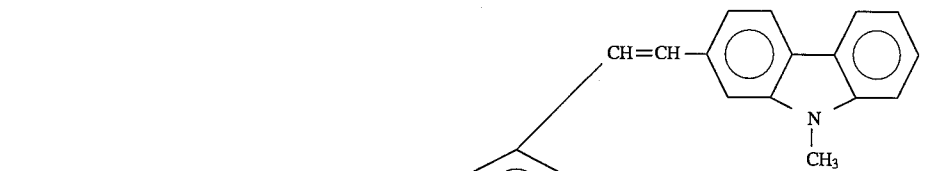

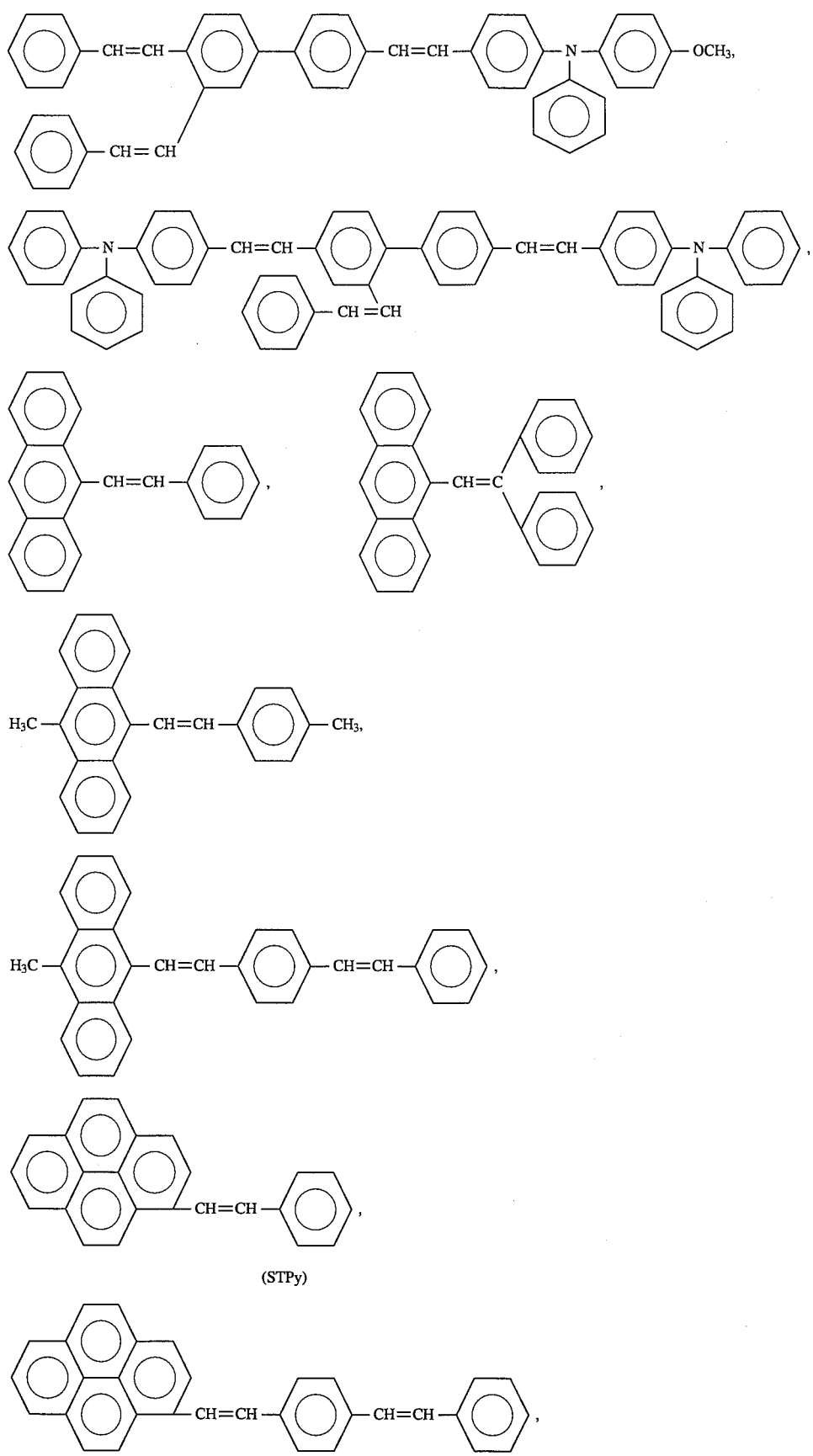

-continued
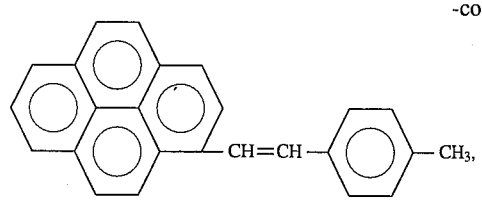
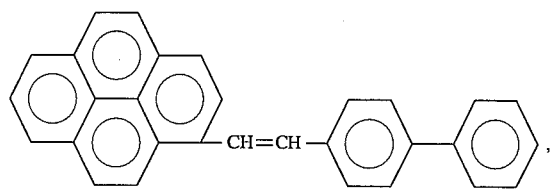
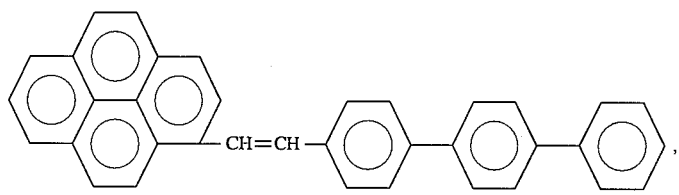
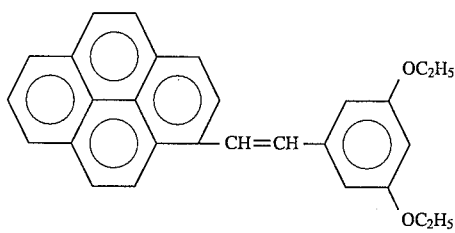
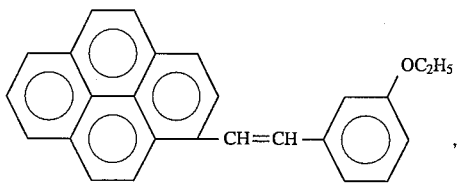
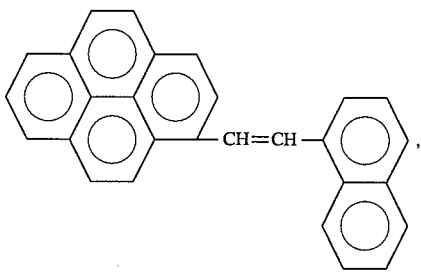
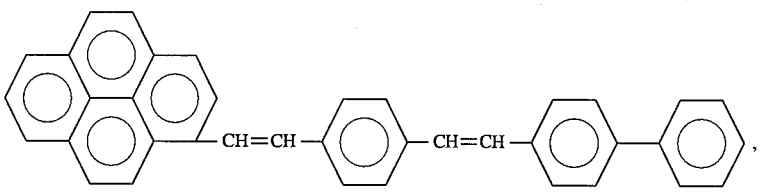
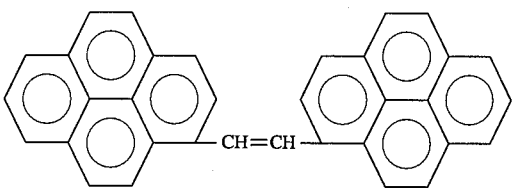

-continued
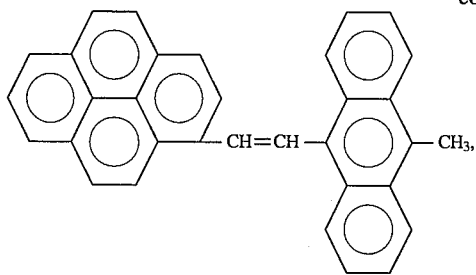
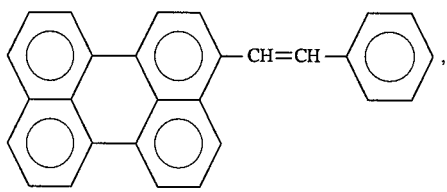
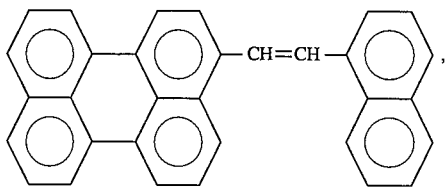
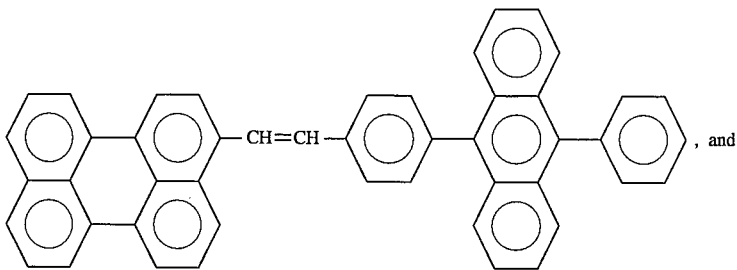, and
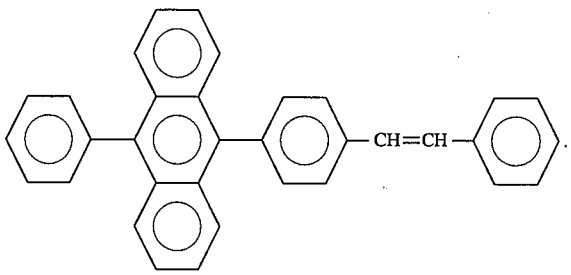.
14. The functional layer according to claim 1, wherein the charge injection auxiliary material comprises a compound selected from the group consisting of
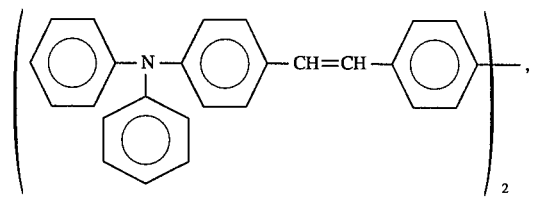
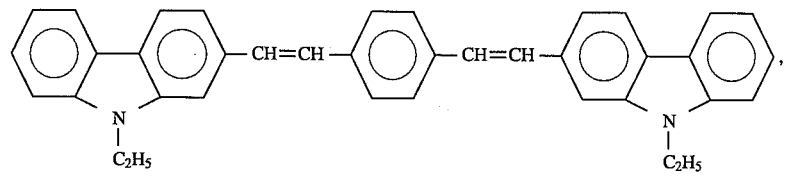,

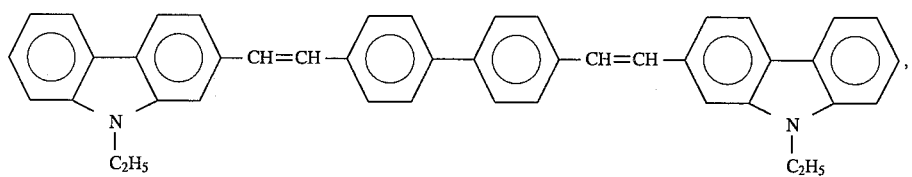
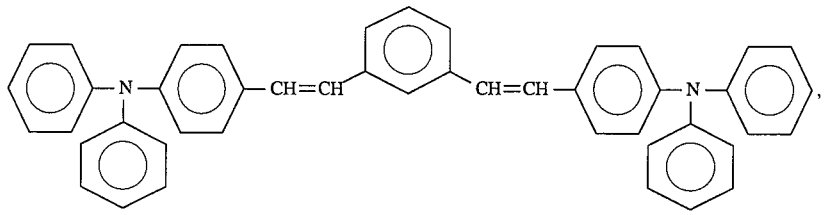
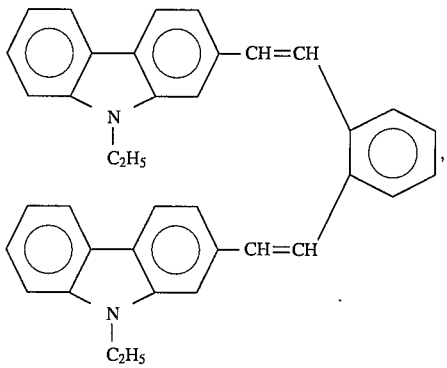
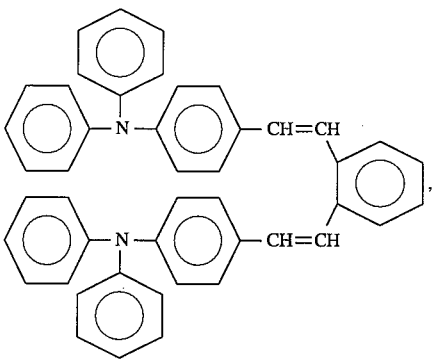
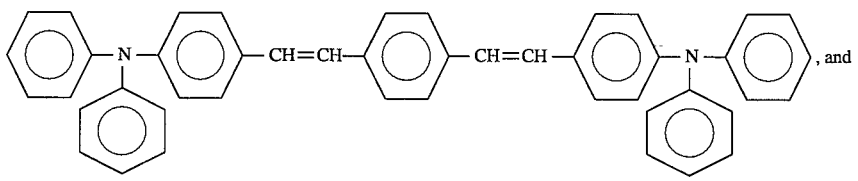
, and
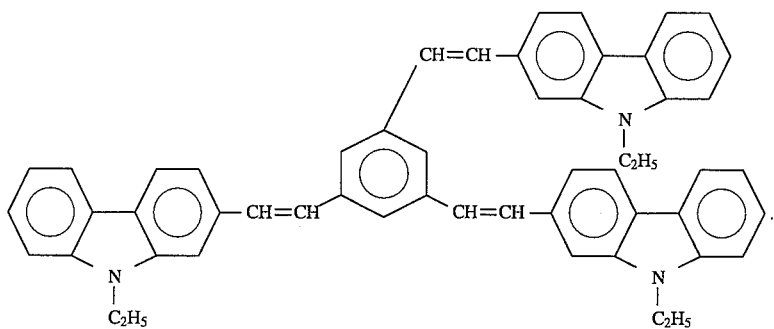

15. The organic electroluminescence device according to claim 8, wherein the charge injection auxiliary material is contained in an amount of 0.5 to 5% by weight of the light emitting material.
16. The organic electroluminescence device according to claim 15, wherein the charge injection auxiliary material comprises a compound
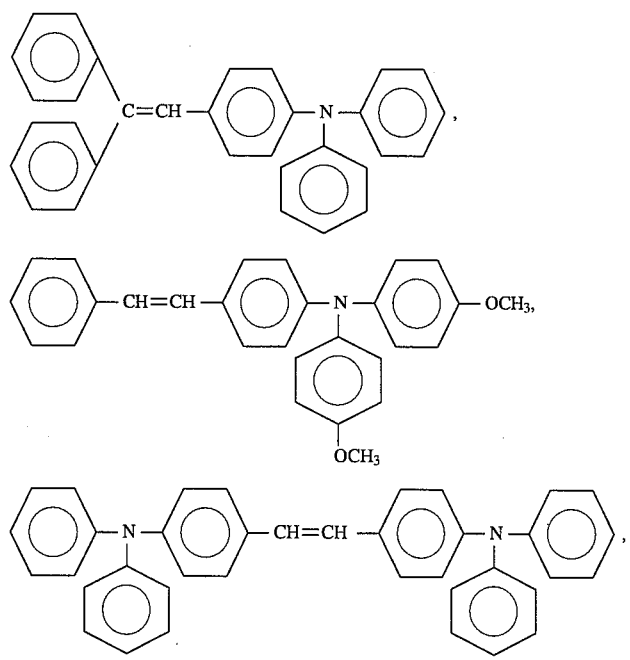
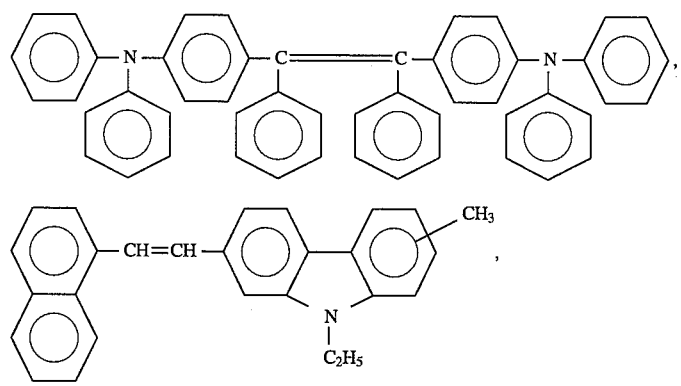

-continued
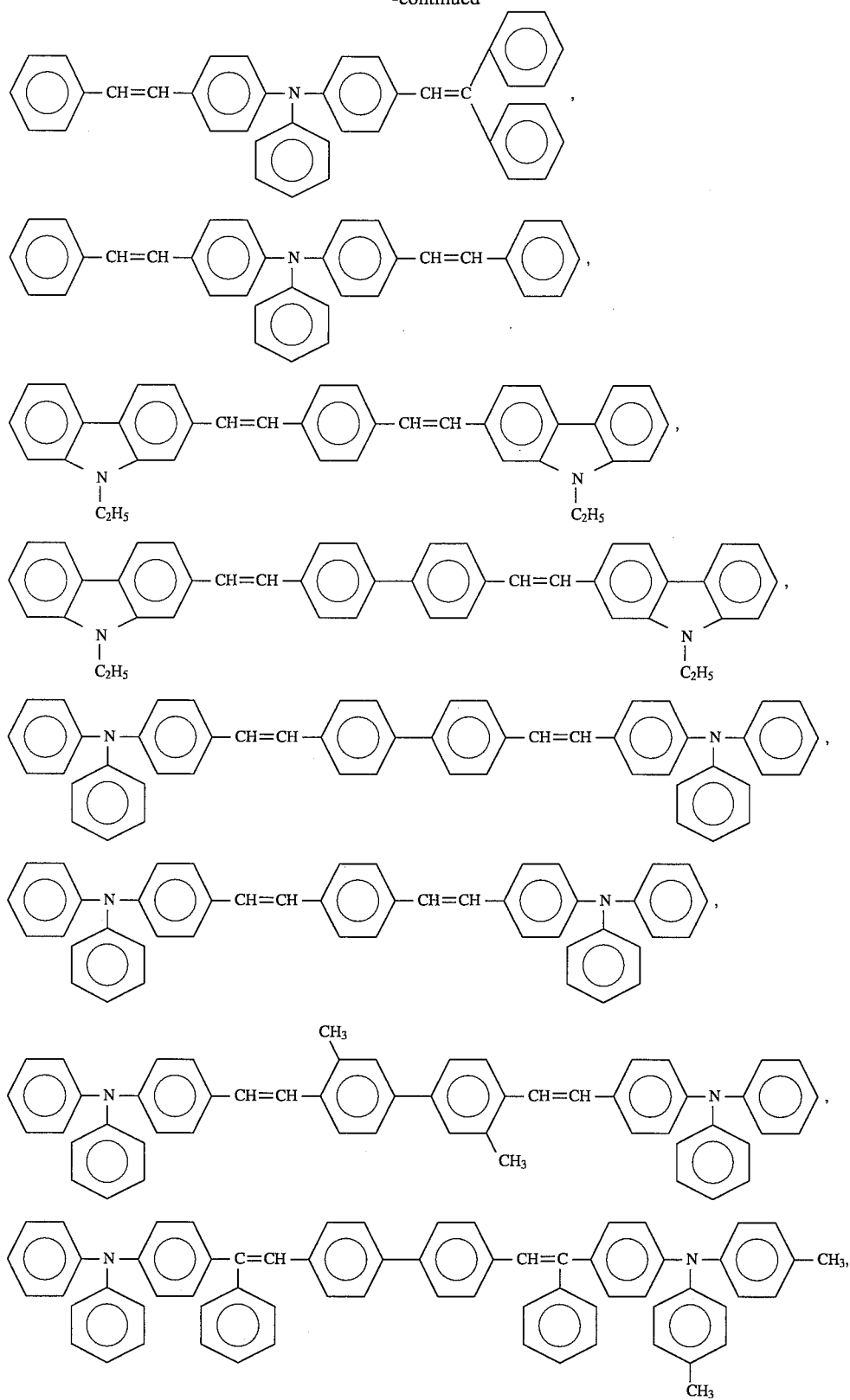

-continued
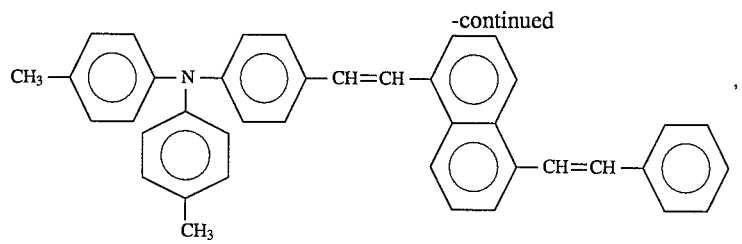
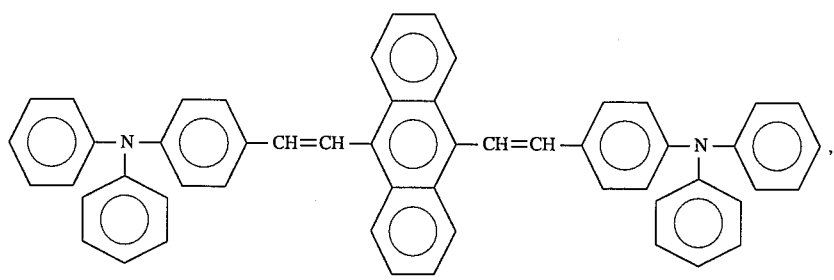
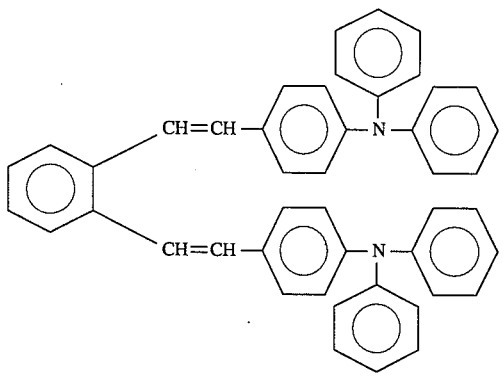
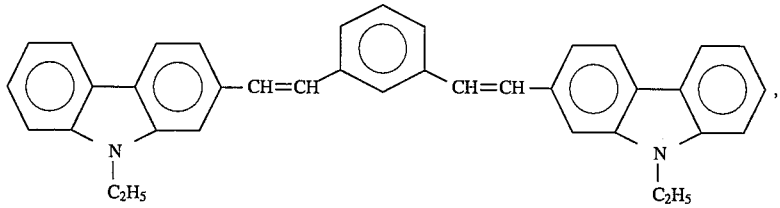
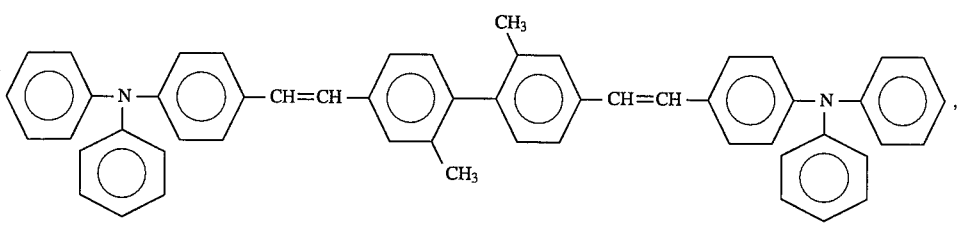
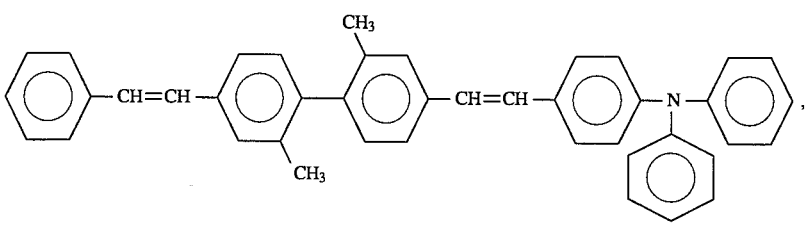

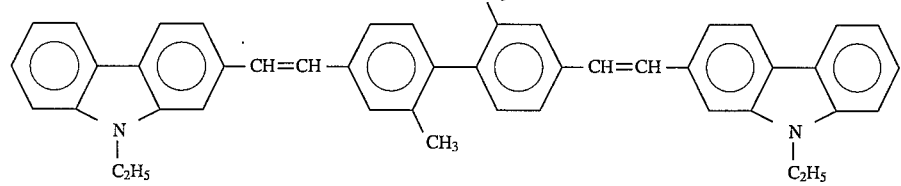
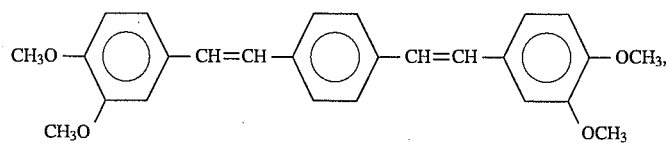
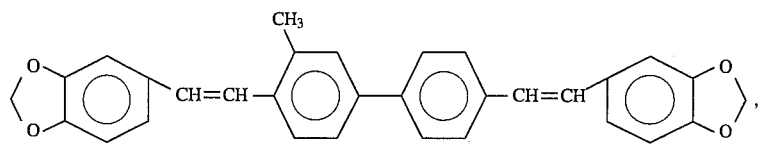
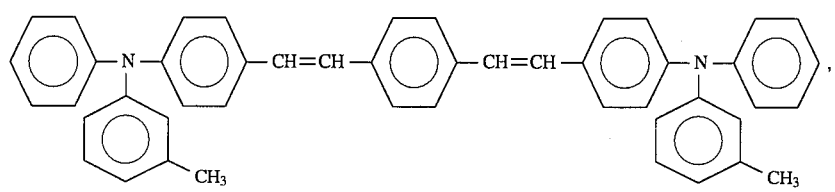
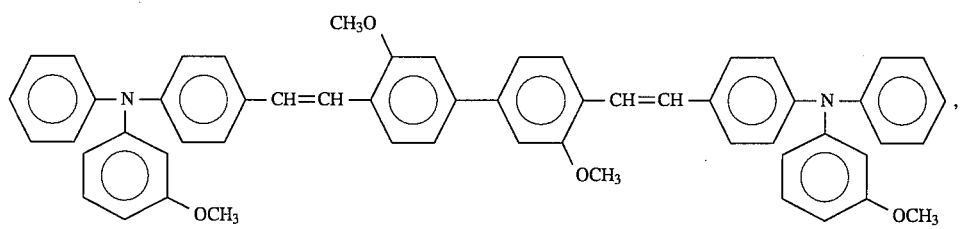
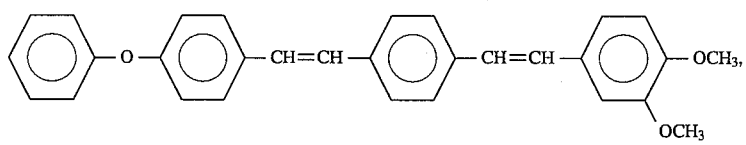
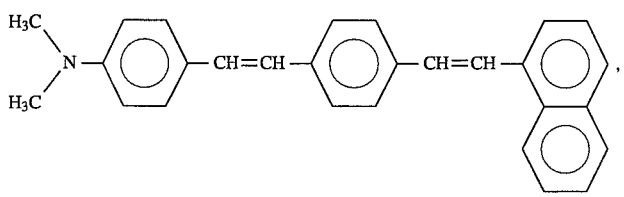
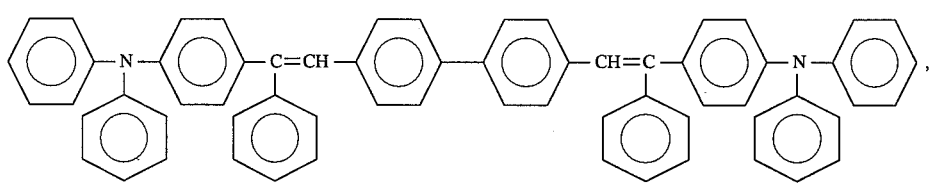
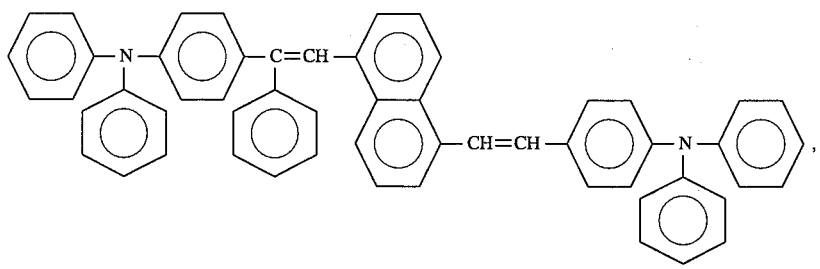

-continued
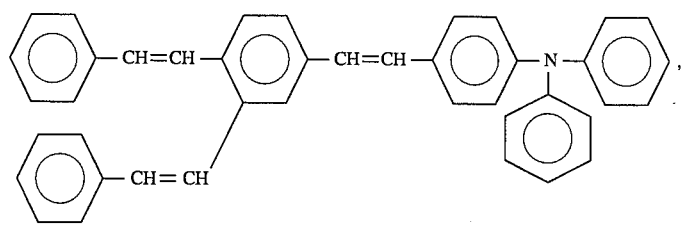,
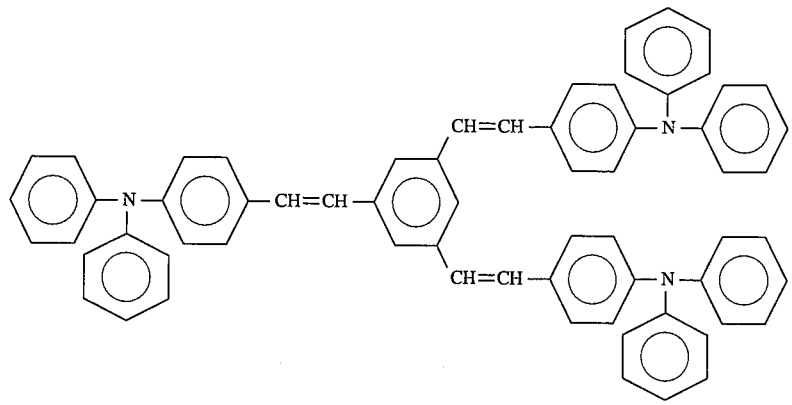,
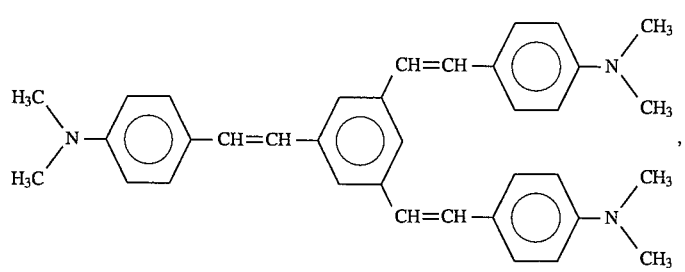,
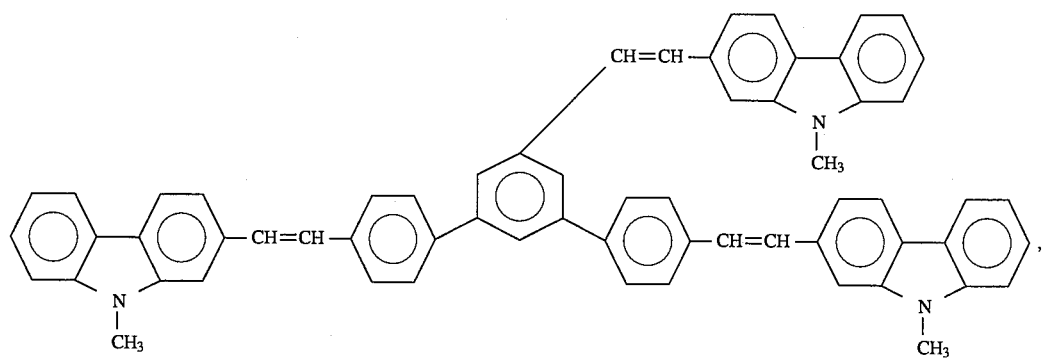,
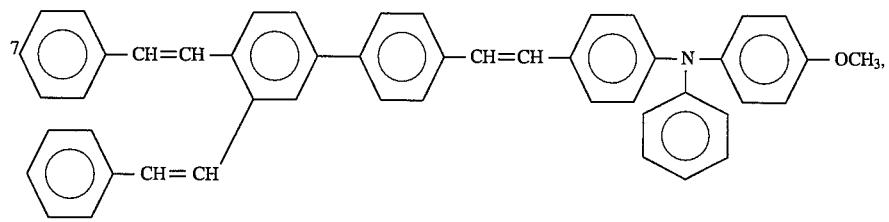,
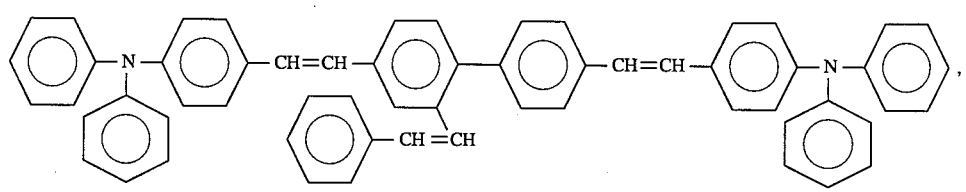,

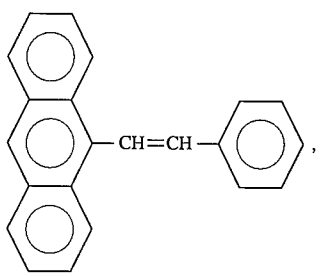
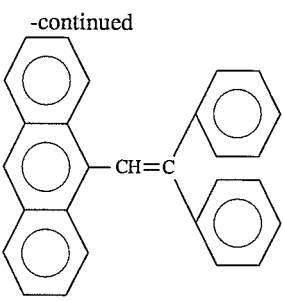
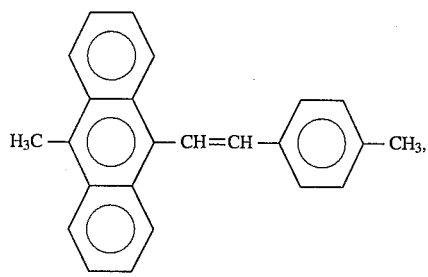
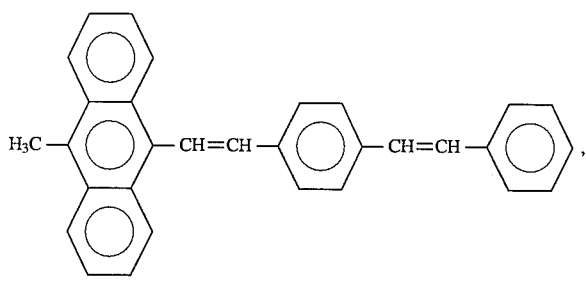
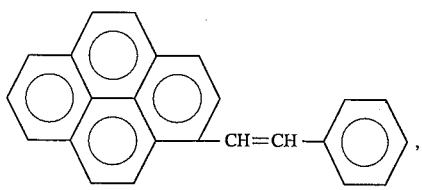
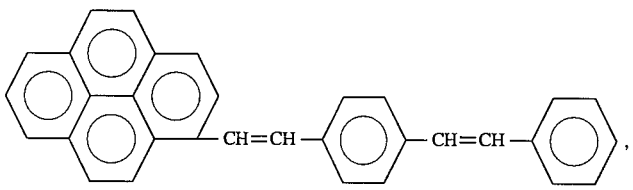
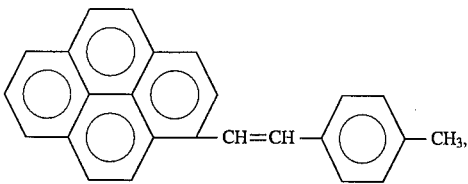
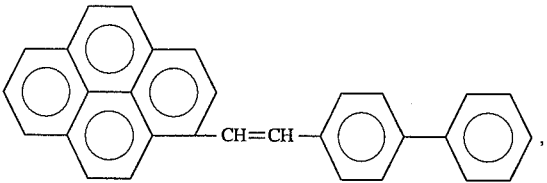

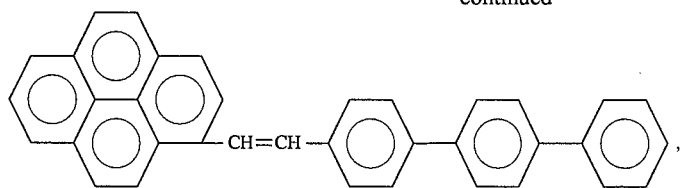
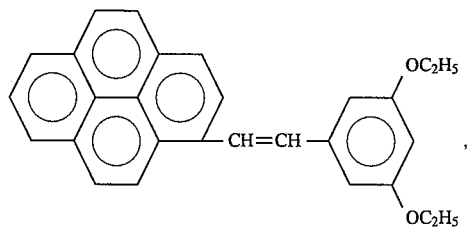
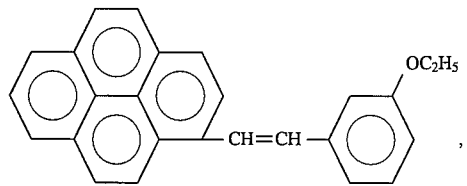
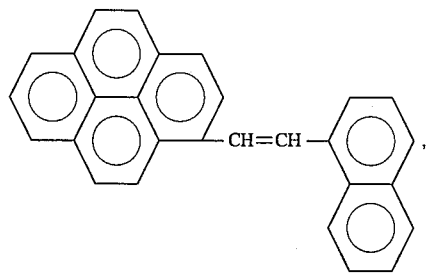
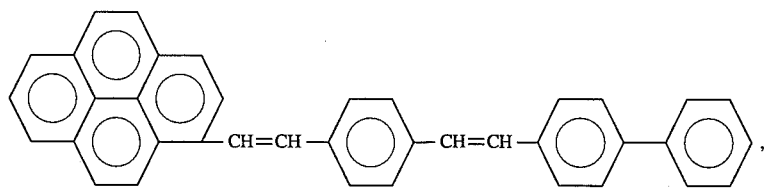
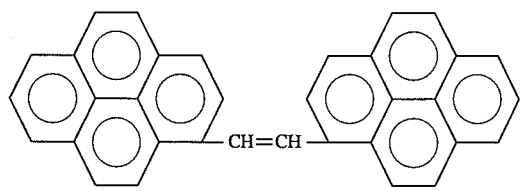
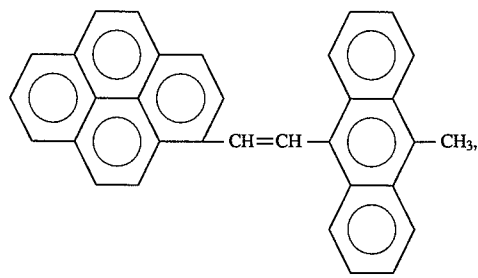

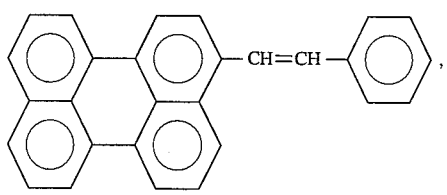
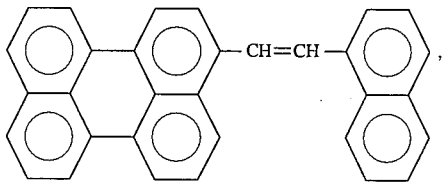
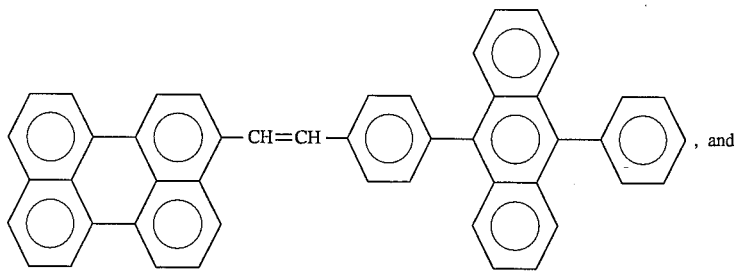, and
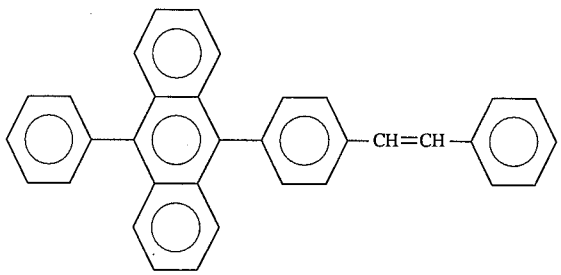.
17. The organic electroluminescence device according to claim 15, wherein the charge injection auxiliary material comprises a compound
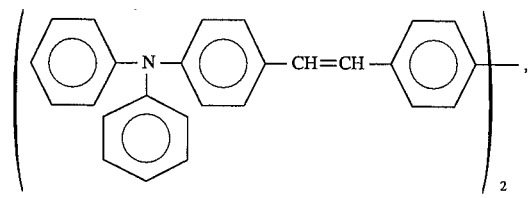
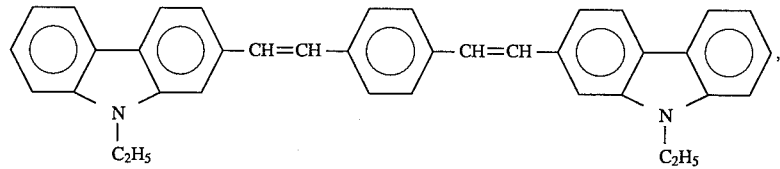,
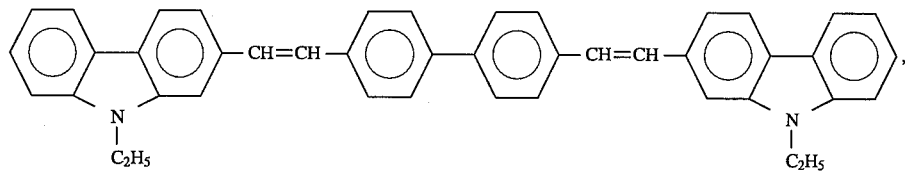, -continued

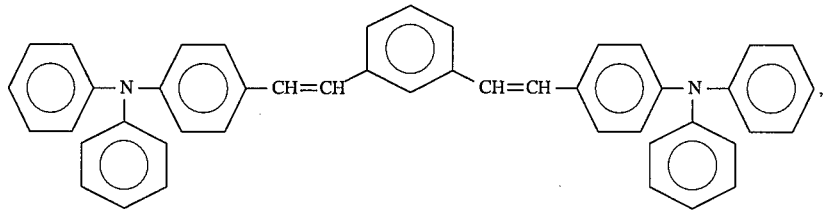

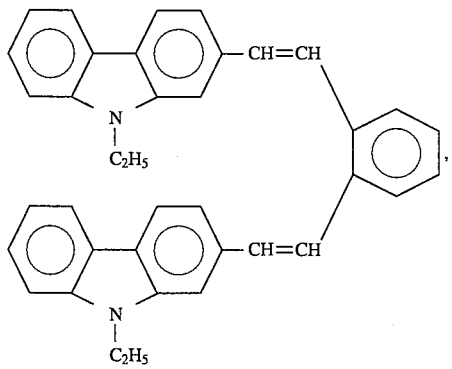

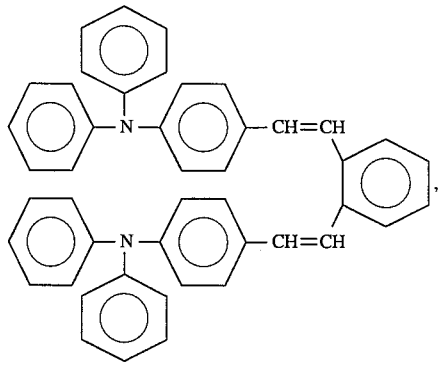

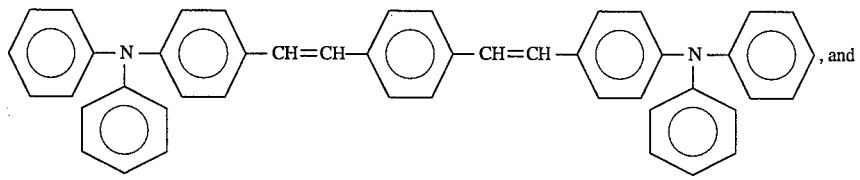

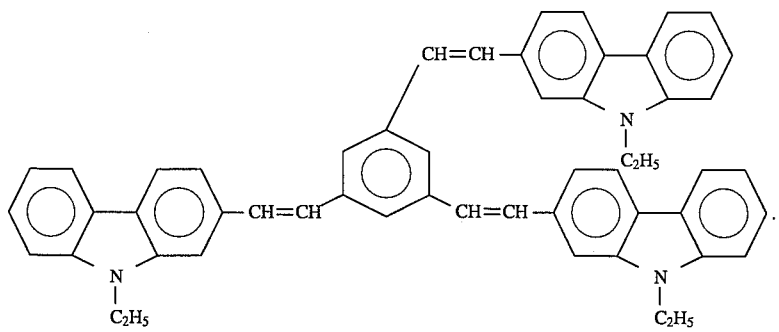

18. A functional layer of an organic electron device, said functional layer comprising a positive-hole transporting organic substance which is subjected to a positive-hole injection from an external layer and has enhanced positive-hole injection properties by incorporation of a charge injection auxiliary material in said functional layer, said charge injection auxiliary material comprising a distyrylarylene or tris(styrylarylene) compound, said charge injection auxiliary material being in an amount of 0.05 to 9% by weight based on the weight of the positive-hole transporting organic substance.

* * * * *

UNITED STATES PATENT AND TRADEMARK OFFICE
CERTIFICATE OF CORRECTION

PATENT NO. : 5,536,949
DATED : July 16, 1996
INVENTOR(S) : Hosokawa et al

It is certified that error appears in the above-identified patent and that said Letters Patent is hereby corrected as shown below:

Column 62, line 16 (Claim 9): after "claim 8," insert --wherein--.

Signed and Sealed this

First Day of June, 1999

Q. TODD DICKINSON

*Attest:*

*Attesting Officer*     Acting Commissioner of Patents and Trademarks